United States Patent
Willcock

(10) Patent No.: US 10,431,263 B2
(45) Date of Patent: *Oct. 1, 2019

(54) SIMULATING ACCESS LINES

(71) Applicant: Micron Technology, Inc., Boise, ID (US)

(72) Inventor: Jeremiah J. Willcock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/997,389

(22) Filed: Jun. 4, 2018

(65) Prior Publication Data

US 2018/0286468 A1 Oct. 4, 2018

Related U.S. Application Data

(63) Continuation of application No. 15/645,238, filed on Jul. 10, 2017, now Pat. No. 9,990,966, which is a
(Continued)

(51) Int. Cl.
*G11C 7/06* (2006.01)
*G11C 5/06* (2006.01)
(Continued)

(52) U.S. Cl.
CPC .............. *G11C 7/065* (2013.01); *G11C 5/066* (2013.01); *G11C 7/08* (2013.01); *G11C 7/1036* (2013.01);
(Continued)

(58) Field of Classification Search
CPC .. G11C 7/065; G11C 7/08; G11C 7/10; G11C 7/1036; G11C 7/1063; G11C 7/1069; G11C 5/066; G11C 19/00; G11C 11/4096
(Continued)

(56) References Cited

U.S. PATENT DOCUMENTS

| | | | |
|---|---|---|---|
| 4,380,046 A | 4/1983 | Fung | |
| 4,435,792 A | 3/1984 | Bechtolsheim | |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Tan T. Nguyen
(74) *Attorney, Agent, or Firm* — Brooks, Cameron & Huebsch, PLLC

(57) ABSTRACT

Examples of the present disclosure provide apparatuses and methods for simulating access lines in a memory. An example method can include receiving a first bit-vector and a second bit-vector in a format associated with storing the first bit-vector in memory cells coupled to a first access line and a first number of sense lines and storing the second bit-vector in memory cells coupled to a second access line and the first number of sense lines. The method can include storing the first bit-vector in a number of memory cells coupled to the first access line and a second number of sense lines and storing the second bit-vector in a number of memory cells coupled to the first access line and a third number of sense lines, wherein a quantity of the first number of sense lines is less than a quantity of the second and third number of sense lines.

20 Claims, 14 Drawing Sheets

Related U.S. Application Data continuation of application No. 15/179,338, filed on Jun. 10, 2016, now Pat. No. 9,704,541.

(60) Provisional application No. 62/174,996, filed on Jun. 12, 2015.

(51) Int. Cl.
   G11C 7/08      (2006.01)
   G11C 7/10      (2006.01)
   G11C 11/4096   (2006.01)
   G11C 19/00     (2006.01)

(52) U.S. Cl.
   CPC .......... *G11C 7/1063* (2013.01); *G11C 7/1069* (2013.01); *G11C 11/4096* (2013.01); *G11C 7/10* (2013.01); *G11C 19/00* (2013.01)

(58) Field of Classification Search
   USPC .................................................. 365/189.05
   See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,873,630 A | 10/1989 | Rusterholz et al. |
| 4,958,378 A | 9/1990 | Bell |
| 4,977,542 A | 12/1990 | Matsuda et al. |
| 5,014,235 A * | 5/1991 | Morton .................. G06F 5/015 365/185.11 |
| 5,023,838 A | 6/1991 | Herbert |
| 5,029,134 A | 7/1991 | Watanabe |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,542,421 B2 | 4/2003 | Sugamoto |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,839,698 B2 | 11/2010 | Joo |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |

(56) References Cited

U.S. PATENT DOCUMENTS

| | | |
|---|---|---|
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2009/0303767 A1 | 12/2009 | Akerib et al. |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0063915 A1* | 3/2014 | Cronie ............... G11C 7/1006 365/149 |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0357047 A1* | 12/2015 | Tiwari ............... G06F 9/30029 714/719 |
| 2016/0064047 A1 | 3/2016 | Tiwari |
| 2016/0196856 A1 | 7/2016 | Tiwari et al. |
| 2016/0267951 A1* | 9/2016 | Tiwari ............... G11C 11/4091 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |

(56) References Cited

FOREIGN PATENT DOCUMENTS

| KR | 10-2013-0049421 | 5/2013 |
|---|---|---|
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi.forum.org/docs/mpi-1./mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).

\* cited by examiner

SIMULATING ACCESS LINES

PRIORITY INFORMATION

This application is a Continuation of U.S. application Ser. No. 15/645,238, filed Jul. 10, 2017, which issues as U.S. Pat. No. 9,990,966 on Jun. 5, 2018, which is a Continuation of U.S. application Ser. No. 15/179,338, filed Jun. 10, 2016, which issued as U.S. Pat. No. 9,704,541 on Jul. 11, 2017, which claims the benefit of U.S. Provisional Application No. 62/174,996, filed Jun. 12, 2015, the contents of which are included herein by reference.

TECHNICAL FIELD

The present disclosure relates generally to semiconductor memory apparatuses and methods, and more particularly, to apparatuses and methods related to simulating access lines in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array) to execute instructions. Data can be moved from the memory array to registers external to the memory array via a bus.

DETAILED DESCRIPTION

Figure 1:
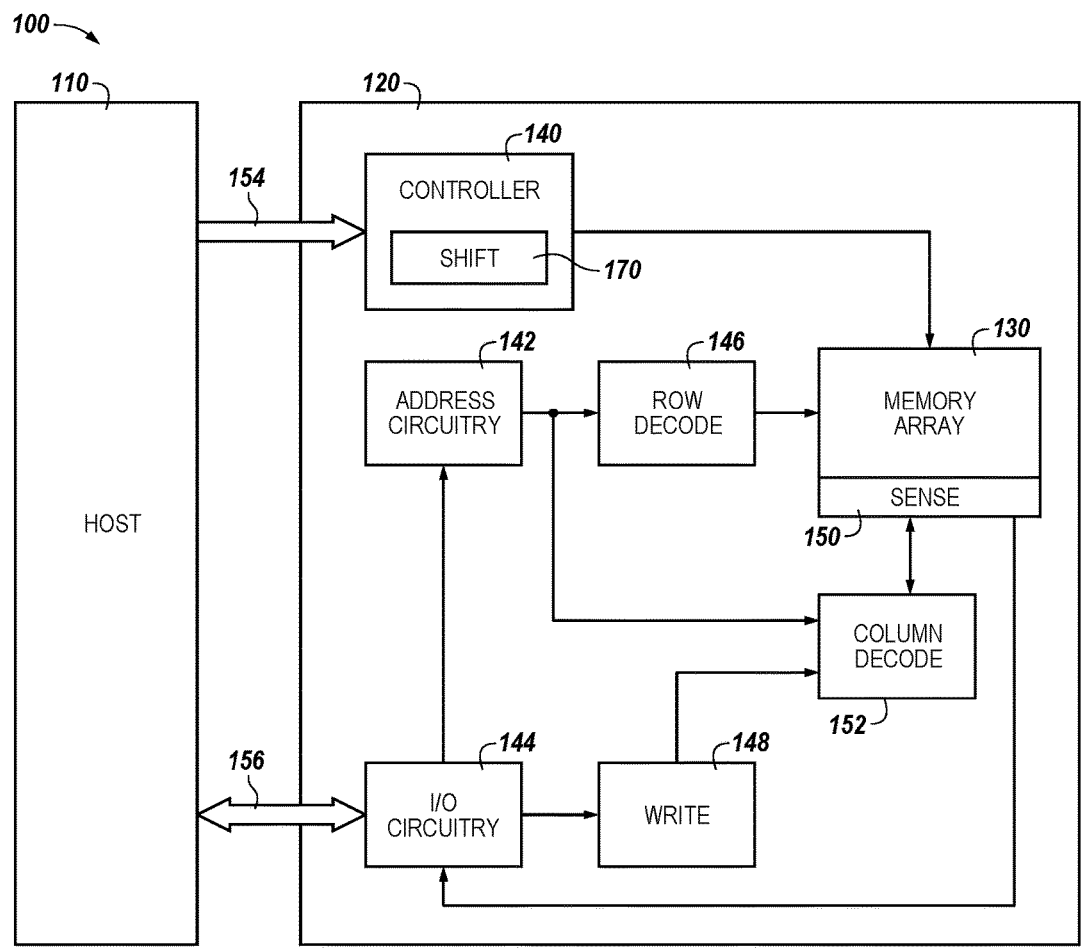
FIG. 1 is a block diagram of an apparatus in the form of a computing system including a memory device in accordance with a number of embodiments of the present disclosure.

The present disclosure includes apparatuses and methods related to simulating access lines in memory. Access lines can be simulated by receiving a first bit-vector and a second bit-vector in a format associated with storing the first bit-vector in memory cells coupled to a first access line and a first number of sense lines and storing the second bit-vector in memory cells coupled to a second access line and the first number of sense lines. The method can include storing the first bit-vector in a number of memory cells coupled to the first access line and a second number of sense lines and storing the second bit-vector in a number of memory cells coupled to the first access line and a third number of sense lines, wherein a quantity of the first number of sense lines is less than a quantity of the second and the third number of sense lines. A quantity of the first number of sense lines can be less than a quantity of the second and the third number of sense lines. The method can also include performing an operation on the first bit-vector and the second bit-vector.

A memory device can comprise one or more banks, each of which is an array of sense lines and access lines (which may be referred to herein as word lines or select lines). Each sense line can be coupled to a plurality of sense amplifiers and/or compute components. A memory array can be used to perform a number of operations. A speed associated with performing a number of operations in a memory array can be based on a quantity of sense lines in the memory array. A memory size of the memory array and/or memory device can be based on a quantity of access lines and a quantity of sense lines.

Simulated hardware is implemented using physical hardware. A memory array with a first quantity of sense lines and first quantity of access lines can simulate a memory array with a second quantity of sense lines and a second quantity of access lines, the first quantity of sense lines being greater than the second quantity of sense lines and the second quantity of access lines being greater than the first quantity of access lines. For example, a simulated memory array with 612 sense lines and 1024 access lines can be simulated (e.g., emulated) using a physical memory array with 1024 sense lines and 612 access lines. As used herein, the term physical is used to differentiate hardware from simulated hardware. As such, a physical access line is a non-simulated access line. As used herein, simulating a memory array can include simulating a number of sense lines and access lines that compose the simulated memory array.

A first type of operation can be executed on a first memory array with more sense lines and fewer access lines than a second memory array. A second type of operation can be executed on a second memory array with fewer sense lines and more access lines than the first memory array. It may be desirable to use a memory array to execute both types of operations. For example, a first memory array with more sense lines and fewer access lines than a second memory array can be used to execute both types of operations by simulating the second memory array using the first memory array.

Simulating the second memory array using the first memory array with more sense lines and fewer access lines than the second memory array provides the ability to perform both types of operations efficiently. In a number of examples, performing a number of operations on a simulated second memory array using the first memory array with more sense lines and fewer access lines than the simulated second memory array can be faster than performing the number of operations on a non-simulated second memory array with fewer sense lines and more access lines than the first memory array because the first memory array has more sense lines than the non-simulated second memory array.

A simulated second memory array with more access lines and fewer sense lines can be emulated by a first memory array with more sense lines and fewer access lines than a second memory array if the quantity of sense lines in the first memory array is greater than the quantity of sense lines in the second memory array and if the quantity of access lines in the first memory array is less than the quantity of access lines in the second memory array. A memory array with a first quantity of sense lines and a first quantity of access lines can emulate a simulated memory array with a second quantity of sense lines and a second quantity of access lines if a product of the first quantity of sense lines and the first quantity of access lines is at least a product of the second quantity of sense lines and the second quantity of access lines. In a number of examples, a portion of the sense lines and/or a portion of the access lines of a physical memory array can be used to emulate a simulated array that is comprised of simulated sense lines and simulated access lines provided that the product of the portion of sense lines and the portion of the access lines of the physical array is equal to the product of the number of simulated sense lines and the number of simulated access lines of the simulated array.

A number of embodiments of the present disclosure can provide a reduction of the number of computations and/or time involved in performing operations in a simulated array using a physical memory array. For instance, the number of computations and/or the time can be reduced due to an ability to perform various portions of the number of operations in parallel (e.g., simultaneously). Performing a number of operations as described herein can also reduce power consumption as compared to previous approaches. In accordance with a number of embodiments, an operation can be performed on a simulated memory array using a physical memory array without transferring data out of the memory array and/or sensing circuitry via a bus (e.g., data bus, address bus, control bus, etc.). An operation can involve performing a number of operations (e.g., AND operations, OR operations, SHIFT operations, INVERT operations, and an any-bit-set testing operation, referred to herein as a Block_OR operation, etc.). The Block_OR operation can determine whether a particular bit is stored within a number of memory cells, for example, whether a "1" bit is stored in any memory cell of a group of memory cells (such as memory cells 303-0 to 303-J in array 330 of FIG. 3 described below). However, embodiments are not limited to these examples of operations.

In various previous approaches, performing an operation on a bit-vector can include transferring the bit-vector from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, often only a single operation can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU). For example, moving the data from the memory array to the processing resource can include performing a sense line address access (e.g., firing of a column decode signal) in order to transfer data from sense lines onto I/O lines, moving the data to the array periphery, and providing the data to a register in association with performing an operation, for instance.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example.

For example, the sensing circuitry 150 described herein can be formed on a same pitch as a pair of complementary sense lines. As an example, a pair of complementary memory cells may have a cell size with a $6F^2$ pitch (e.g., 3F×2F). If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines. In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "S," "T," "U," "V," "W," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2, and a similar element may be referenced as 331 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2 and 3.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 (e.g., memory controller) decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

An example of the sensing circuitry 150 is described further below in association with FIGS. 2A and 2B. For instance, in a number of embodiments, the sensing circuitry 150 can comprise a number of sense amplifiers and a number of compute components, each of which may comprise a latch serving as an accumulator and can be used to perform logical operations (e.g., on data associated with complementary sense lines). In a number of embodiments, the sensing circuitry (e.g., 150) can be used to perform operations using data stored in a simulated array using physical array 130 as inputs and store the results of the operations back to the array 130 without transferring via a sense line address access (e.g., without firing a column decode signal). As such, operations can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on control circuitry 140 or elsewhere)).

In various previous approaches, data associated with an operation, for instance, would be read from memory via sensing circuitry and provided to an external ALU. The external ALU circuitry would perform the operations using bit-vectors (which may be referred to as operands or inputs) and the result could be transferred back to the array via the local I/O lines. In contrast, in a number of embodiments of the present disclosure, sensing circuitry (e.g., 150) is configured to perform an operation on data stored in memory cells in memory array 130 that emulate a simulated memory array and store the result back to the array 130 without enabling a local I/O line coupled to the sensing circuitry.

As such, in a number of embodiments, registers and/or an ALU external to array 130 and sensing circuitry 150 may not be needed to perform the operation as the sensing circuitry 150 can be operated to perform the appropriate computations involved in performing the operation using the address space of memory array 130 that emulates a simulated array. Additionally, the operation can be performed without the use of an external processing resource.

Figure 2A:
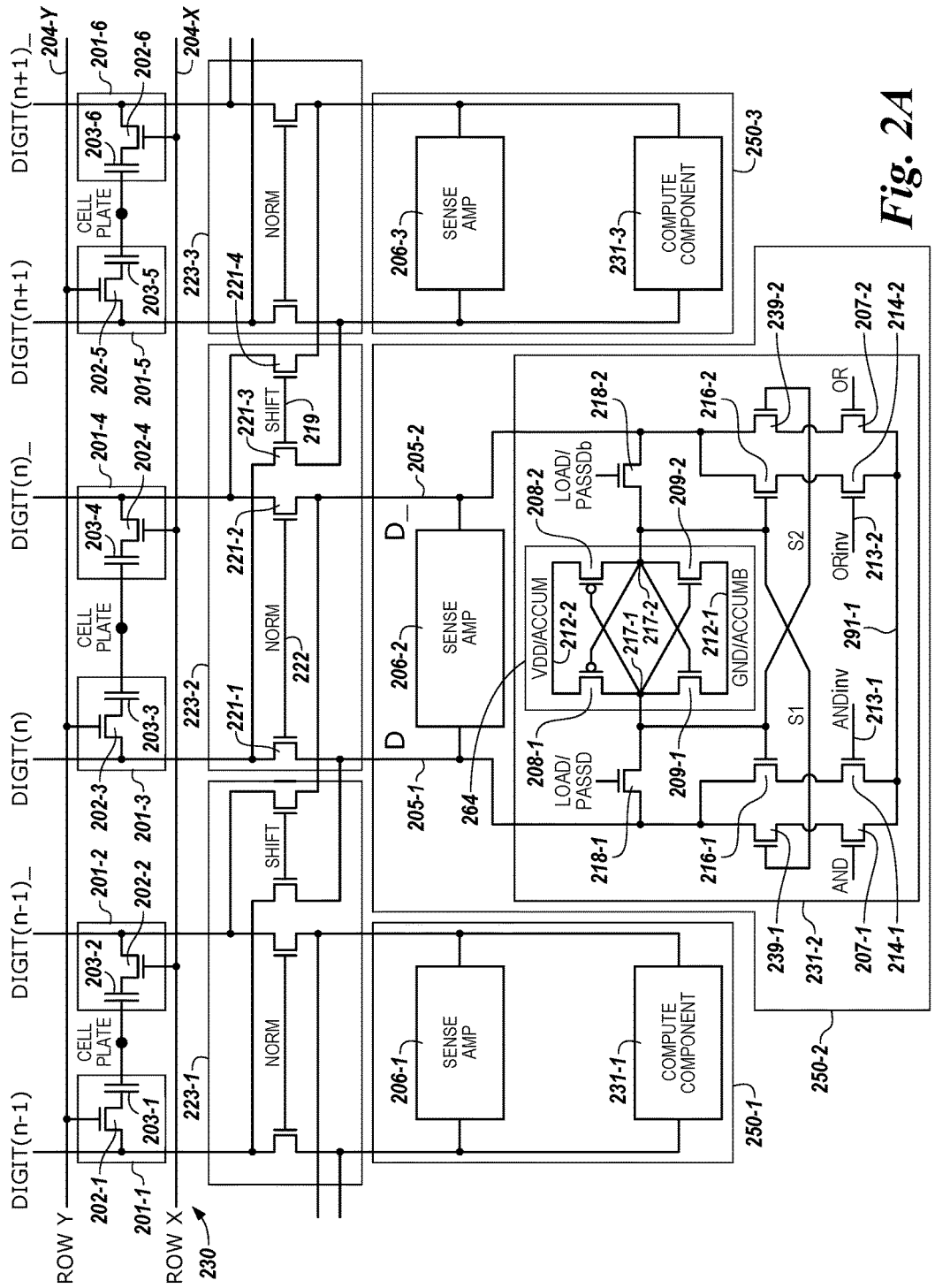
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. A memory cell (e.g., one of memory cells 201-1, 201-2, 201-3, 201-4, 201-5, 201-6) comprises a storage element (e.g., one of corresponding capacitors 203-1 to 203-6) and an access device (e.g., one of corresponding transistors 202-1 to 202-6). For instance, memory cell 201-3 comprises transistor 202-3 and capacitor 203-3 memory cell 201-4 comprises transistor 202-4 and capacitor 203-4, memory cell 201-3 comprises transistor 202-3 and capacitor 203-3, and memory cell 201-4 comprises transistor 202-4 and capacitor 203-4, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/ DIGIT(n−1)_, DIGIT(n)/DIGIT(n)_, DIGIT(n+1)/DIGIT (n+1)_. The individual data lines corresponding to each pair of complementary data lines can also be referred to as data lines 205-1 (D) and 205-2 (D_) respectively. Although only three pairs of complementary data lines are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-3 can be coupled to data line 205-1 (D), a second source/drain region of transistor 202-3 can be coupled to capacitor 203-3, and a gate of a transistor 202-3 can be coupled to word line 204-Y. A first source/drain region of a transistor 202-4 can be coupled to data line 205-2 (D_), a second source/drain region of transistor 202-4 can be coupled to capacitor 203-4, and a gate of a transistor 202-4 can be coupled to word line 204-X. The cell plate, as shown in FIG. 2A, can be coupled to each of capacitors 203-3 and 203-4. The cell plate can be a common node to which a reference voltage (e.g., ground) can be applied in various memory array configurations.

The memory array 230 is coupled to sensing circuitry 250-1, 250-2, 250-3, etc., in accordance with a number of embodiments of the present disclosure. Sensing circuitry comprises a sense amplifier and a compute component corresponding to respective columns of memory cells (e.g., coupled to respective pairs of complementary data lines). In this example, the sensing circuitry 250-1 comprises a sense amplifier 206-1 and a compute component 231-1 corresponding to respective columns of memory cells (e.g., memory cells 201-1 and 201-2 coupled to respective pairs of complementary data lines). Sensing circuitry 250-2 comprises a sense amplifier 206-2 and a compute component 231-2 corresponding to respective columns of memory cells (e.g., memory cells 201-3 and 201-4 coupled to respective pairs of complementary data lines). Sensing circuitry 250-3 comprises a sense amplifier 206-3 and a compute component 231-3 corresponding to respective columns of memory cells (e.g., memory cells 201-5 and 201-6 coupled to respective pairs of complementary data lines). A sense amplifier (e.g., sense amplifier 206-1) can comprise a cross coupled latch, which can be referred to herein as a primary latch. The sense amplifier (e.g., sense amplifier 206-1) can be configured, for example, as described with respect to FIG. 2B.

In the example illustrated in FIG. 2A, the circuitry corresponding to compute component 231-2 comprises a static latch 264 and an additional number of (e.g., ten) transistors that implement, among other things, a dynamic latch. For ease of reference, compute component 231-2 has been illustrated in an expanded format to describe the functioning of the compute component. Additional compute components (e.g., compute components 231-1 and 231-3) include elements of the expanded format of compute component 231-2 but are not illustrated in FIG. 2A. The dynamic latch and/or static latch 264 of the compute component 231-2 can be collectively referred to herein as a secondary latch, which can serve as an accumulator. As such, the compute component 231-2 can operate as and/or be referred to herein as an accumulator. The compute component 231-2 can be coupled to each of the data lines D 205-1 and D_ 205-2 as shown in FIG. 2A. The transistors of compute component 231-2 can all be n-channel transistors (e.g., NMOS transistors), for example. However, embodiments are not limited to this example.

In this example, data line D 205-1 can be coupled to a first source/drain region of transistors 216-1 and 239-1, as well as to a first source/drain region of load/pass transistor 218-1. Data line D_ 205-2 can be coupled to a first source/drain region of transistors 216-2 and 239-2, as well as to a first source/drain region of load/pass transistor 218-2.

The gates of load/pass transistor 218-1 and 218-2 can be commonly coupled to a LOAD control signal, or respectively coupled to a PASSD/PASSDB control signal, as discussed further below. A second source/drain region of load/pass transistor 218-1 can be directly coupled to the gates of transistors 216-1 and 239-2. A second source/drain region of load/pass transistor 218-2 can be directly coupled to the gates of transistors 216-2 and 239-1.

A second source/drain region of transistor 216-1 can be directly coupled to a first source/drain region of pull-down transistor 214-1. A second source/drain region of transistor 239-1 can be directly coupled to a first source/drain region of pull-down transistor 207-1. A second source/drain region of transistor 216-2 can be directly coupled to a first source/drain region of pull-down transistor 214-2. A second source/drain region of transistor 239-2 can be directly coupled to a first source/drain region of pull-down transistor 207-2. A second source/drain region of each of pull-down transistors 207-1, 207-2, 214-1, and 214-2 can be commonly coupled together to a reference voltage (e.g., ground (GND) 291-1). A gate of pull-down transistor 207-1 can be coupled to an AND control signal line, a gate of pull-down transistor 214-1 can be coupled to an ANDinv control signal line 213-1, a gate of pull-down transistor 214-2 can be coupled to an ORinv control signal line 213-2, and a gate of pull-down transistor 207-2 can be coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating a LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231-2 shown in FIG. 2A has the benefit of balancing the sense amplifier for functionality when the pull-down transistors 207-1, 207-2, 214-1, and 214-2 are conducting before the sense amplifier 206-2 is fired (e.g., during pre-seeding of the sense amplifier 206-2). As used herein, firing the sense amplifier 206-2 refers to enabling the sense amplifier 206-2 to set the primary latch and subsequently disabling the sense amplifier 206-2 to retain the set primary latch. Performing logical operations after equilibration is disabled (in the sense amplifier), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ORinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each have a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors.

According to some embodiments, the gate of load/pass transistor 218-1 can be coupled to a PASSD control signal, and the gate of load/pass transistor 218-2 can be coupled to a PASSDB control signal. In the configuration where the gates of transistors 218-1 and 218-2 are respectively coupled to one of the PASSD and PASSDB control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors. As used herein, configuration is intended to mean size, doping level, and transition type.

Load transistors can be configured (e.g., can be sized, doped, etc.) to handle loading specifications associated with coupling data lines to the local dynamic nodes S1 and S2, for example. Pass transistors, however, can be configured to handle heavier loading associated with coupling data lines to an adjacent accumulator (e.g., through the adjacent compute component 231-3 and shift circuitry 223-2 in memory array 230, as shown in FIG. 2A). According to some embodiments, load/pass transistors 218-1 and 218-2 can be configured to accommodate the heavier loading corresponding to a pass transistor but be coupled and operated as a load transistor. For example, load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute component 231-2, including the latch 264, can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 includes four transistors 208-1, 208-2, 209-1, and 209-2 coupled to a pair of complementary data lines D 205-1 and D_ 205-2 through load/pass transistors 218-1 and 218-2. However, embodiments are not limited to this configuration. The latch 264 can be a cross coupled latch. For example, the gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2. As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
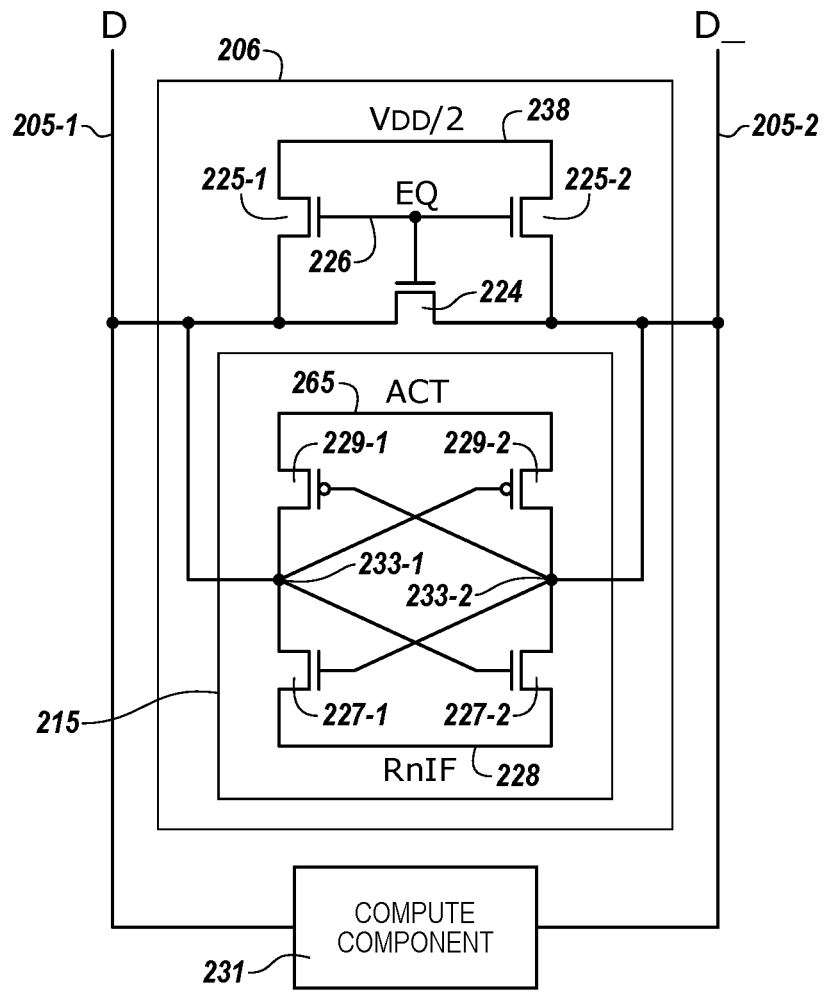
FIG. 2B illustrates a schematic diagram of a portion of sensing circuitry in accordance with a number of embodiments of the present disclosure.

In this example, a second source/drain region of transistor 209-1 and 209-2 is commonly coupled to a negative control signal line 212-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

As shown in FIG. 2A, the sense amplifier 206-2 and the compute component 231-2 can be coupled to the array 230 via shift circuitry 223-2. In some examples, sensing circuitry 250-2 can include shifting circuitry 223-2 and/or sensing circuitry 223-1. In this example, the shift circuitry 223-2 comprises a pair of isolation devices (e.g., isolation transistors 221-1 and 221-2) coupled to data lines 205-1 (D) and 205-2 (D_), respectively. The isolation transistors 221-1 and 221-2 are coupled to a control signal 222 (NORM) that, when activated, enables (e.g., turns on) the isolation transistors 221-1 and 221-2 to couple the corresponding sense amplifier 206-2 and compute component 231-2 to a corresponding column of memory cells (e.g., to a corresponding pair of complementary data lines 205-1 (D) and 205-2 (D_)). According to various embodiments, conduction of isolation transistors 221-1 and 221-2 can be referred to as a "normal" configuration of the shift circuitry 223-2.

In the example illustrated in FIG. 2A, the shift circuitry 223-2 includes another (e.g., a second) pair of isolation devices (e.g., isolation transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206-2 and compute component 231-2 are coupled to a different pair of complementary data lines (e.g., a pair of complementary data lines different than the pair of complementary data lines to which isolation transistors 221-1 and 221-2 couple the particular sense amplifier 206-2 and compute component 231-2), or can couple a particular sense amplifier 206-2 and compute component 231-2 to another memory array (and isolate the particular sense amplifier 206-2 and compute component 231-2 from a first memory array). According to various embodiments, the shift circuitry 223-2 can be arranged as a portion of (e.g., within) the sense amplifier 206-2, for instance.

Although the shift circuitry 223-2 shown in FIG. 2A includes isolation transistors 221-1 and 221-2 used to couple particular sensing circuitry 250-2 (e.g., a particular sense amplifier 206-2 and corresponding compute component 231-2) to a particular pair of complementary data lines 205-1 (D) and 205-2 (D_) (e.g., DIGIT(n) and DIGIT(n)_) and isolation transistors 221-3 and 221-4 are arranged to couple the particular sensing circuitry 250-2 to an adjacent pair of complementary data lines in one particular direction (e.g., adjacent data lines DIGIT(n+1) and DIGIT(n+1)_ shown to the right in FIG. 2A), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2A). Shift circuitry 223-1 can include isolation transistors used to couple particular sensing circuitry 250-1 to a particular pair of complementary data lines (e.g., DIGIT(n−1) and DIGIT(n−1)_) and isolation transistors arranged to couple the particular sensing circuitry 250-1 to an adjacent pair of complementary data lines in one particular direction (e.g., adjacent data lines DIGIT(n) and DIGIT(n) shown in FIG. 2A). Shift circuitry 223-3 can include isolation transistors used to couple particular 250-3 to a particular pair of complementary data lines (e.g., DIGIT(n+1) and DIGIT(n+1)_) and isolation transistors arranged to couple the particular sensing circuitry 250-3 to an adjacent pair of complementary data lines in one particular direction (e.g., adjacent data lines DIGIT (n) and DIGIT(n)_ to the left and DIGIT(n+2) and DIGIT(n+2)_ to the right (not shown)).

Embodiments of the present disclosure are not limited to the configuration of shift circuitry 223-2 shown in FIG. 2A. For example, determining whether to shift in a particular direction to perform a shift operation is independent of the circuitry implementation. In a number of embodiments, shift circuitry 223-2 such as that shown in FIG. 2A can be operated (e.g., in conjunction with sense amplifiers 206-2 and compute components 231-2) in association with performing mathematical operations such as adding and subtracting operations without transferring data out of the sensing circuitry 250-2 via an I/O line (e.g., local I/O line (IO/IO_)), for instance.

Although not shown in FIG. 2A, each column of memory cells can be coupled to a column decode line that can be activated to transfer, via local I/O line (e.g., I/O line 334 in FIG. 3), a data value from a corresponding sense amplifier 206-2 and/or compute component 231-2 to a control component external to the array such as an external processing resource (e.g., host processor and/or other functional unit circuitry). The column decode line can be coupled to a column decoder. However, as described herein, in a number of embodiments, data need not be transferred via such I/O lines to perform logical operations in accordance with embodiments of the present disclosure. In a number of embodiments, shift circuitry 223-2 can be operated in conjunction with sense amplifiers 206-2 and compute components 231-2 to perform logical operations without transferring data to a control component external to the array, for instance.

The functionality of the sensing circuitry 250-2 of FIG. 2A is described below and summarized in Table 1 below with respect to performing logical operations and initially storing a result in the sense amplifier 206-2. Initially storing the result of a particular logical operation in the primary latch of sense amplifier 206-2 can provide improved versatility as compared to previous approaches in which the result may initially reside in a secondary latch (e.g., accumulator) of a compute component 231-2, and then be subsequently transferred to the sense amplifier 206-2, for instance.

TABLE 1

| Operation | Accumulator | Sense Amplifier |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206-2 (e.g., without having to perform an additional operation to move the result from the compute component 231-2 (e.g., accumulator) to the sense amplifier 206-2) is advantageous because, for instance, the result can be written to a row (of the array of memory cells) or back into the accumulator without performing a precharge cycle (e.g., on the complementary data lines 205-1 and/or 205-2).

FIG. 2B illustrates a schematic diagram of a portion of sensing circuitry in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206-2) can comprise a number of transistors formed on pitch with the transistors of the corresponding compute component 231-2 and/or the memory cells of an array (e.g., 230 shown in FIG. 2A) to which they are coupled, which may conform to a particular feature size (e.g., $4F^2$, $6F^2$, etc.). Sense amplifier 206-2 comprises a latch 215 including four transistors coupled to a pair of complementary data lines D 205-1 and D_ 205-2. The latch 215 can be a cross coupled latch. For example, the gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2. As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the primary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231-2, which may be referred to herein as an accumulator, can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 265 (ACT). The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206-2 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 226 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206-2 and compute component 231-2, and the result can be stored in the sense amplifier and/or compute component.

The sensing circuitry 250-2 (e.g., 250-2 in FIG. 2A) can be operated in several modes to perform logical operations, including a first mode in which a result of the logical operation is initially stored in the sense amplifier 206-2, and a second mode in which a result of the logical operation is initially stored in the compute component 231-2. Additionally with respect to the first operating mode, sensing circuitry 250-2 can be operated in both pre-sensing (e.g., sense amplifiers fired before logical operation control signal active) and post-sensing (e.g., sense amplifiers fired after logical operation control signal active) modes with a result of a logical operation being initially stored in the sense amplifier 206-2.

As described further below, the sense amplifier 206-2 can, in conjunction with the compute component 231-2, be operated to perform various logical operations using data from an array as input. In a number of embodiments, the result of a logical operation can be stored back to the array without transferring the data via a data line address access (e.g., without firing a column decode signal such that data is transferred to circuitry external to the array and sensing circuitry via local I/O lines). As such, a number of embodiments of the present disclosure can enable performing various operations (e.g., logical operations, mathematical operations, etc.) using less power than various previous approaches. Additionally, since a number of embodiments eliminate the need to transfer data across I/O lines in order to perform operations (e.g., between memory and discrete processor), a number of embodiments can enable an increased parallel processing capability as compared to previous approaches.

Figure 3:
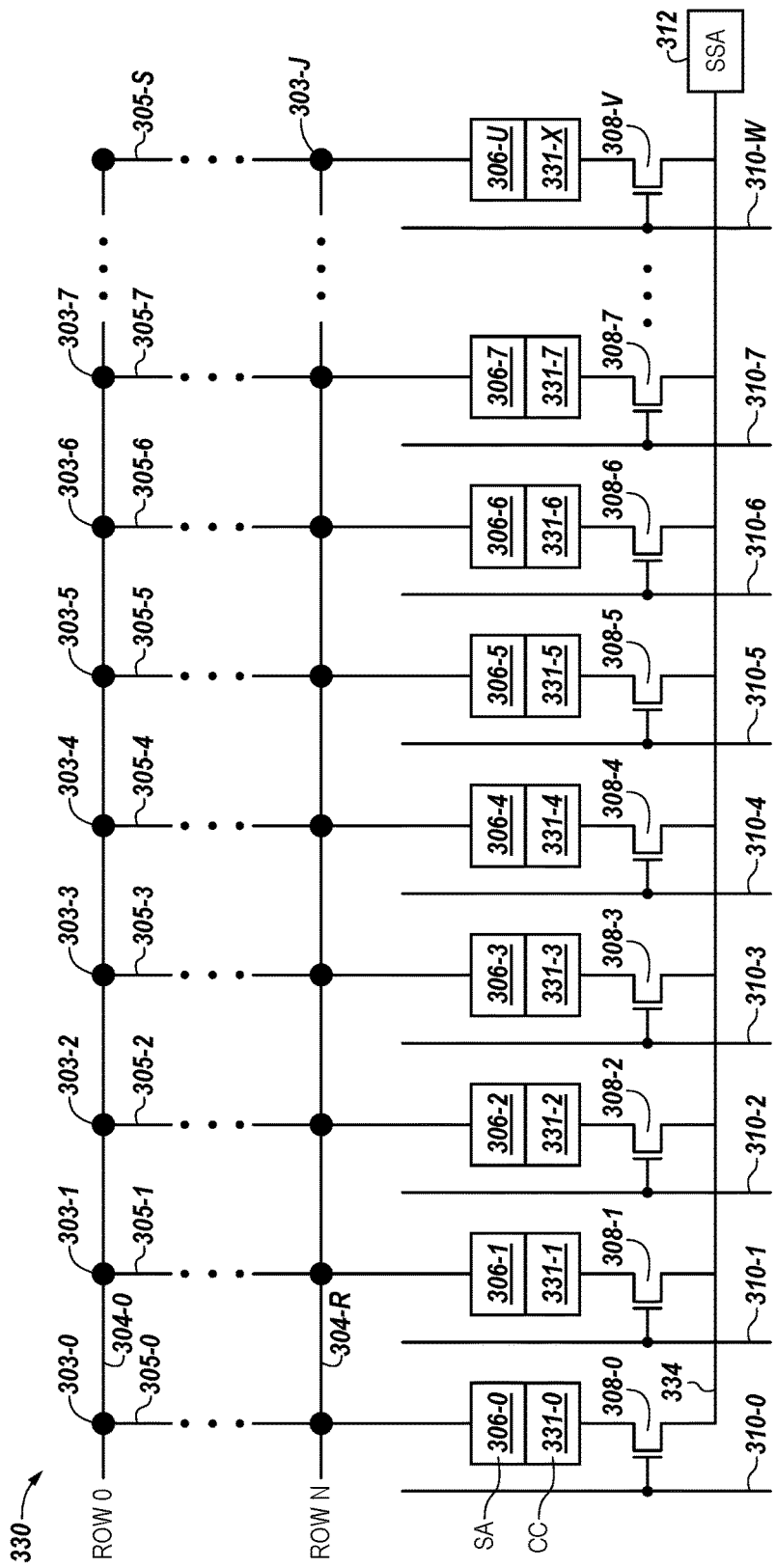
FIG. 3 illustrates a schematic diagram of a portion of a memory array in accordance with a number of embodiments of the present disclosure.

FIG. 3 illustrates a schematic diagram of a portion of a memory array 330 in accordance with a number of embodiments of the present disclosure. The array 330 includes memory cells (referred to generally as memory cells 303, and more specifically as 303-0 to 303-J) coupled to rows of access lines 304-0, 304-1, 304-2, 304-3, 304-4, 304-5, 304-6, . . . , 304-R and columns of sense lines 305-0, 305-1, 305-2, 305-3, 305-4, 305-5, 305-6, 305-7, . . . , 305-S. Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

The columns of memory cells can be coupled to sensing circuitry (e.g., sensing circuitry 150 shown in FIG. 1). In this example, the sensing circuitry comprises a number of sense amplifiers 306-0, 306-1, 306-2, 306-3, 306-4, 306-5, 306-6, 306-7, . . . , 306-U coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-1, 308-2, 308-3, 308-4, 308-5, 308-6, 308-7, . . . , 308-V. In this example, the sensing circuitry also comprises a number of compute components 331-0, 331-1, 331-2, 331-3, 331-4, 331-5, 331-6, 331-7, . . . , 331-X coupled to the respective sense lines and to the respective sense amplifiers 306-0 to 306-U. The sensing circuitries corresponding to the respective columns can serve as respective processing units (e.g., 1-bit processing elements), which can facilitate performing operations (e.g., logical operations), in parallel, on bit-vectors stored in the array 330. Column decode lines 310-1 to 310-W are coupled to the gates of transistors 308-1 to 308-V, respectively, and can be selectively activated to transfer data sensed by respective sense amplifiers 306-0 to 306-U and/or stored in respective compute components 331-0 to 331-X to a secondary sense amplifier 312. In a number of embodiments, the compute components 331 can be formed on pitch with the memory cells of their corresponding columns and/or with the corresponding sense amplifiers 306.

In a number of embodiments, the sensing circuitry (e.g., compute components 331 and sense amplifiers 306) is configured to perform an operation on bit-vectors stored in array 330 that emulates a simulated array. As an example, a first bit-vector can be stored in a first group of memory cells coupled to a number of sense lines (e.g., a first group of sense lines from 305-0 to 305-S) and to a number of access lines (e.g., a 304-0 to 304-R), and a second bit-vector can be stored in a second group of memory cells coupled to a different number of sense lines (e.g., a second group of sense lines from 305-0 to 305-S) and the number of access lines (e.g., 304-0 to 304-R). The result of the operation can be stored (e.g., as a bit-vector(s)) in a third group of memory cells coupled to the number of access lines (e.g., 304-0 to 304-R) and to a different and/or same number of sense lines (e.g., a third group of sense lines from 305-0 to 305-S). For example, the third group of memory cells can be a same group of memory cells as the first group of memory cells or the second group of memory cells (e.g., a result of an operation can be written over a currently stored bit-vector).

Figure 4A:
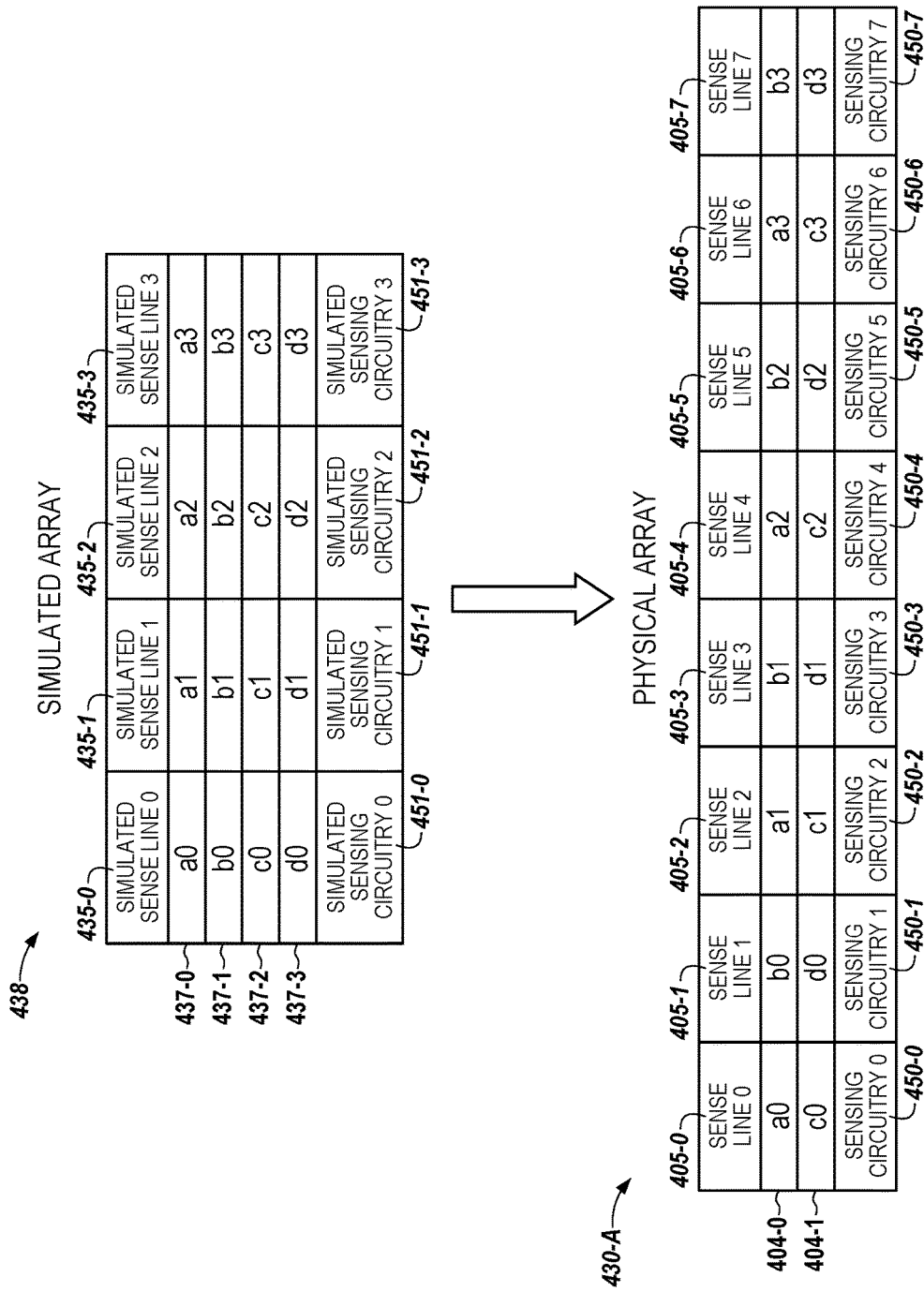
FIG. 4A-4B illustrate tables showing a simulated memory array and a physical memory array in accordance with a number of embodiments of the present disclosure.

An example, performing an operation on bit-vectors stored in array 330 that emulates a simulated array is described below in association with FIG. 4A-4B, which illustrates tables showing the states of an array (e.g., 330). The example shown in FIG. 4A is associated with performing an operation on a first bit-vector stored in memory cells coupled to access lines 304-0 to 304-1 and to sense lines 305-0 to 305-7 and a second bit-vector stored in memory cells coupled to access lines 304-0 to 304-1 and to sense lines 305-0 to 305-7. The memory array emulates a simulated array that stores the first bit-vector in memory cells coupled to a number of simulated access lines and a number of simulated sense lines and a second bit-vector in memory cells coupled to the number of simulated access lines and the number of simulated sense lines. In the examples provided in FIGS. 4A and 4B a first bit-vector is represented using $a_0$, $a_1$, $a_2$, $a_3$, a second bit-vector is represented using $b_0$, $b_1$, $b_2$, $b_3$, a third bit-vector is represented using $c_0$, $c_1$, $c_2$, $c_3$, and a fourth bit-vector is represented using $d_0$, $d_1$, $d_2$, $d_3$. The first bit-vector, the second bit-vector, the third bit-vector, and the fourth bit-vector are represented by a number of bits $a_0$-$a_3$, and $b_0$-$b_3$, $c_0$-$c_3$, and $d_0$-$d_3$, respectively.

In a number of examples, an operation includes performing a number of AND operations, OR operations, SHIFT operations, INVERT operations, XOR operations, and Block_OR operations. The AND operations, OR operations, SHIFT operations, XOR operations, and INVERT operations can be performed without transferring data via an input/output (I/O) line. The number of AND operations, OR operations, XOR operations, INVERT operations, and SHIFT operations can be performed using sensing circuitry on pitch with the memory array and with each of a number of columns of complementary sense lines.

FIG. 4A illustrates tables showing a simulated memory array 438 and a physical memory array 430-A in accordance with a number of embodiments of the present disclosure. Memory array 430-A includes sense lines 405-0, 405-1, 405-2, 405-3, 405-4, 405-5, 405-6, 405-7, (e.g., referred to generally as sense lines 405) that are analogous to sense lines 305 in FIG. 3, access lines 404-0, 404-1 (e.g., referred to generally as access lines 404) that are analogous to access lines 304, and sensing circuitry 450-0, 450-1, 450-2, 450-3, 450-4, 450-5, 450-6, 450-7 (e.g., referred to generally as sensing circuitry 450) that is analogous to sense amplifiers 306 and compute components 331. Simulated array 438 includes simulated sense lines 435-0, 435-1, 435-2, 435-3 (e.g., referred to generally as simulated sense lines 435), simulated access lines 437-0, 437-1, 437-2, 437-3 (e.g., referred to generally as simulated access lines 437), and simulated sensing circuitry 451-0, 451-1, 451-2, 451-3 (e.g., referred to generally as simulated sensing circuitry 451). Simulated array 438 illustrates a first bit-vector, a second bit-vector, a third bit-vector, and a fourth bit-vector in a format that corresponds to a logical organization (e.g., corresponding logical address locations) in memory cells coupled to the number of access lines 437-0, 437-1, 437-2, 437-3 and to the number of sense lines 435-0, 435-1, 435-2, 435-3.

Figure 4B:
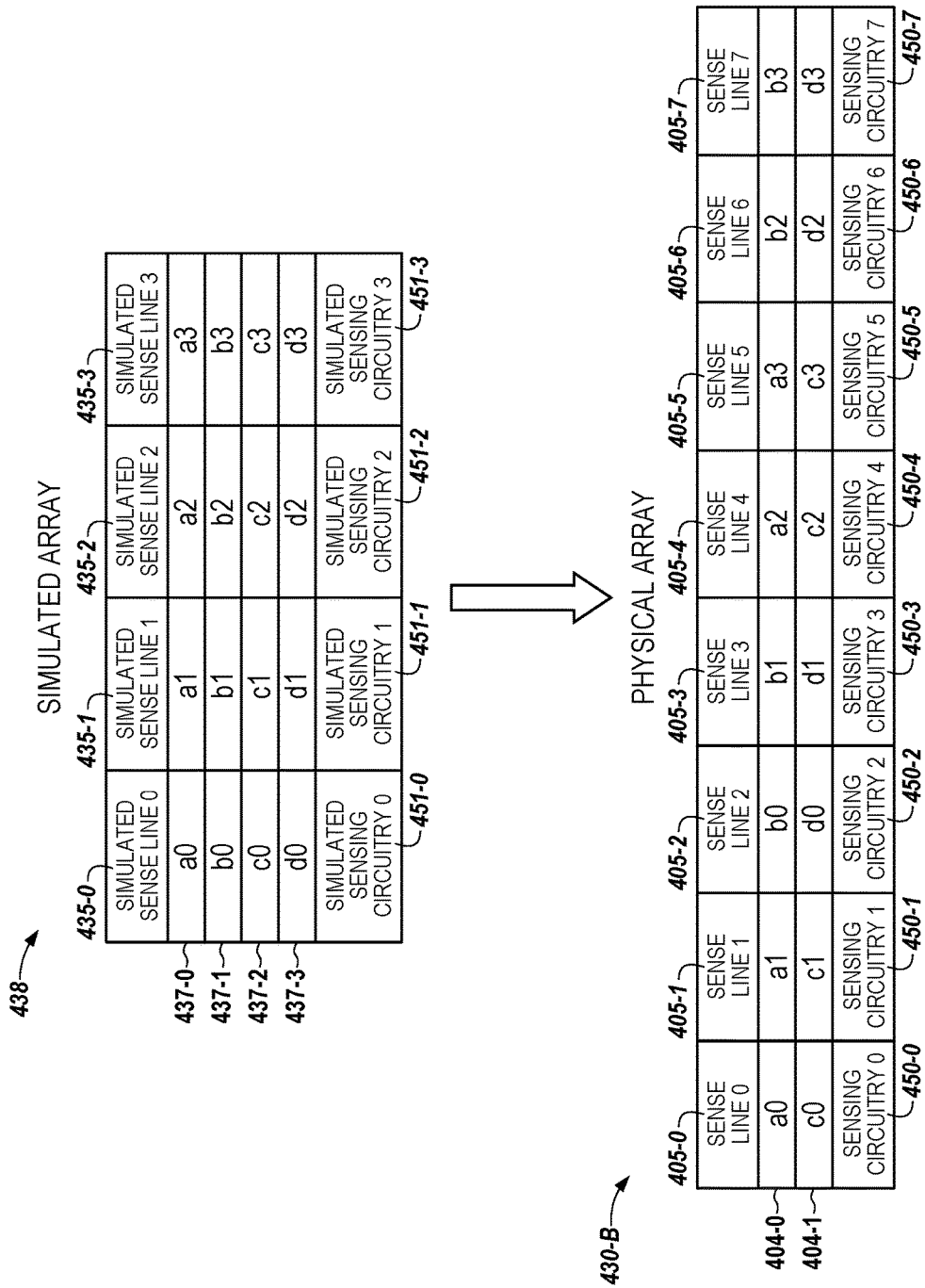

In the examples provided in FIGS. 4A and 4B, the quantity of sense lines 405 is a power of two (e.g., 2, 4, 8, 16, . . . ). The quantity of simulated sense lines 435 is a power of two. The quantity of access lines 404 is a power of two. The quantity of simulated access lines 437 is a power of two. While this example illustrates using a power of two, embodiments are not so limited. Any number can be used depending on the setup of the memory array and how the data is stored. In a number of examples, an array 430-A with c (e.g., 8) sense lines (e.g., 405) and r (e.g., 2) access lines (e.g., 404) emulates an array with c/2 (e.g., 4) simulated sense lines (e.g., 435) and 2r (e.g., 4) simulated access lines (437). However, other ratios (e.g., c:c/3 and r:3r) of sense line 405 to simulated sense lines 435 and access lines 404 to simulated access lines 437 can be implemented.

Emulating simulated array 438 can include dividing the sense lines 405 of the memory array 430-A into a number of equal-sized groups and combining each of the equal size groups of sense lines 405 into a single logical simulated sense line. For example, sense lines 405 can be divided into four equal groups. The first group of sense lines can include sense lines 405-0, 405-1. The second group of sense lines can include sense lines 405-2, 405-3. The third group of sense lines can include sense lines 405-4, 405-5. The fourth group of sense lines can include sense lines 405-6, 405-7. The first group of sense lines can be combined to create a simulated sense line 435-0, the second group of sense lines can be combined to create a simulated sense line 435-1, the third group of sense lines can be combined to create a simulated sense line 435-2, the fourth group of sense lines can be combined to create a simulated sense line 435-3. The equal-sized groups of sense lines 405 can be divided using control software and/or hardware. As such, the first bit-vector to be stored in memory cells coupled to simulated access line 437-0 can be stored in memory cells coupled to access line 404-0. The second bit-vector to be stored in memory cells coupled to simulated access line 437-1 can be stored in memory cells coupled to access line 404-0. The third bit-vector to be stored in memory cells coupled to simulated access line 437-2 can be stored in memory cells coupled to access line 404-1. The fourth bit-vector to be stored in memory cells coupled to simulated access line 437-3 can be stored in memory cells coupled to access line 404-1.

Emulating simulated array 438 can also include mapping simulated access lines 437 to access lines 404. Each of the simulated access lines 437 can be mapped to portions of access lines 404. For example, simulated access line 437-0 maps to a first portion of access line 404-0 that is coupled to sense lines 405-0, 405-2, 405-4, 405-6, simulated access line 437-1 maps to a second portion of access line 404-0 that is coupled to sense lines 405-1, 405-3, 405-5, 405-7, simulated access line 437-2 maps to a first portion of access line 404-1 that is coupled to sense lines 405-0, 405-2, 405-4, 405-6, simulated access line 437-3 maps to a second portion of access line 404-1 that is coupled to sense lines 405-1, 405-3, 405-5, 405-7. For example, memory cells that store $a_0$, $a_1$, $a_2$, $a_3$ in the simulated memory array 437 and are coupled to simulated sense lines 435-0, 435-1, 435-2, 435-3 and simulated access line 437-0 can be mapped to memory cells that store $a_0$, $a_1$, $a_2$, $a_3$ in memory array 430-A and are coupled to access line 404-0 and sense lines 405-0, 405-2, 405-4, 405-6.

As such, a memory array 430-A with access lines 404-0, 404-1 can emulate a simulated array 438 with simulated access lines 437-0 to 437-3 even though the quantity of access lines 404 is less than the quantity of simulated access lines 437. Emulating simulated array 438 using array 430-A with a lesser quantity of access lines 404 than simulated access lines 437 can result in a greater number of sense lines 405 being used to perform an operation as compared to the number simulated sense lines 435.

In FIG. 4A, adjacent sense lines are merged. For instance, sense lines 405-0, 405-1 are merged to emulate simulated sense line 435-0, sense lines 405-2, 405-3 are merged to emulate simulated sense line 435-1, sense lines 405-4, 405-5 are merged to emulate simulated sense line 435-2, sense lines 405-6, 405-7 are merged to emulate simulated sense line 435-3. In FIG. 4B, each of the number of sense lines (e.g., sense lines 405-0, 405-1, sense lines 405-4, 405-5) that are merged are separated by a number of different sense lines (e.g., separated by sense lines 405-2, 405-3 and sense lines 405-6, 405-7).

In a number of examples, a number of sense lines whose associated binary index differs by a particular digit can be combined. For example, a k sense line can be combined with a k XOR n sense line, where n is a power of two that depends on the array's physical structure and k is a physical sense line 405. For example, a first sense line with a decimal 0 index (e.g., a binary 000 index) can be combined with a second sense line with a decimal 2 index (e.g., binary 010) to emulate a first simulated sense line, where the decimal 2 index (e.g., binary 010) is the result of 000 XOR 010 (e.g., k=000 and n=010). A third sense line with a decimal 1 index (e.g., binary 001 index) can be combined with a fourth sense line with a decimal 3 index (e.g., binary 011 index) to emulate a second simulated sense line, where the decimal 3 index (e.g., binary 011 index) is the result of 001 XOR 010 (e.g., k=001 and n=010). A fifth sense line with a decimal 4 index (e.g., binary 100 index) can be combined with a sixth sense line with a decimal 6 index (e.g., binary 110 index) to emulate a third simulated sense line, where the decimal 6 index (e.g., binary 110 index) is the result of 100 XOR 010 (e.g., k=100 and n=010). A seventh sense line with a decimal 5 index (e.g., binary 101 index) can be combined with an eighth sense line with a decimal 7 index (e.g., binary 111 index) to emulate a fourth simulated sense line, where the decimal 7 index (e.g., binary 111 index) is the result of 101 XOR 010 (e.g., k=101 and n=010). In a number of examples, n can be equal to a power of two that is greater than 2 such as 512, 1024, 4096, 8192, or 16384, among other examples of a power of two. The above example is further described in FIG. 4B.

The decision on how to combine sense lines 405 can be based on a communication topology between the different sense lines 405. For example, the decision on how to combine sense lines 405 can be based on a shift circuitry (e.g., shift circuitry 223 in FIG. 2). For example, the shift circuitry 223 shown in FIG. 2 connects adjacent sense lines. However, shift circuitry associated with a memory array can connect non-adjacent sense lines.

The computation capabilities of the sensing circuitry 450 coupled to sense lines 405 can accelerate the performance of a number of operations as compared to the performance of the number of operations using simulated sensing circuitry 451 that is coupled to simulated sense lines 435. For example, performing an OR operation can include performing an OR operation on a first bit-vector "a" (e.g., [$a_0, a_1, a_2, a_3$]) and a second bit-vector "b" (e.g., [$b_0, b_1, b_2, b_3$]) resulting in a bit-vector "e" (e.g., [$e_0, e_1, e_2, e_3$]), not illustrated, wherein $e_0=a_0$ OR $b_0$, $e_1=a_1$ OR $b_1$, $e_2=a_2$ OR $b_2$, and $e_3=a_3$ OR $b_3$. Resulting bit-vector "e" can be stored from the sensing circuitry back into the array 430-A. Examples of performing a logical operation (e.g., OR and AND operations, among other logical operations) are described in FIGS. 6A-7B. In some examples, it can be beneficial to perform an OR operation on a number of different portions of bit-vectors. For example, performing $a_0$ OR $b_0$ in a physical array 430 can include storing $a_0$ in the sensing circuitry 450-0 and shifting $a_0$ from sensing circuitry 450-0 to sensing circuitry 450-1 to align $b_0$ and $a_0$ in a same sense line 405-1. Performing an OR operation can also include storing $b_0$ in the sensing circuitry 450-1 and shifting $b_0$ from sensing circuitry 450-1 to sensing circuitry 450-0, to align $b_0$ and $a_0$ in a same simulated sense line 405-0. Once aligned, the sensing circuitry 450-0, and/or the sensing circuitry 450-1, can perform $a_0$ OR $b_0$. In a number of examples, each OR operation is completed before a subsequent OR operation is performed on a particular one of sensing circuitry 451. For example, a first OR operation can be completed before a second OR operation is performed on sensing circuitry 450-0.

In at least one embodiment, an OR operation can be performed on bit-vectors a and d. For example, an OR operation can be performed on a first bit of each of bit-vectors a and d, along with the second, third, and fourth bits of each of bit-vectors a and d, respectively. Performing $a_0$ OR $d_0$ in a physical array 430 can include storing $a_0$ in the sensing circuitry 450-0 and shifting $a_0$ from sensing circuitry 450-0 to sensing circuitry 450-1 to align $d_0$ and $a_0$ in a same sense line 405-1. Performing an OR operation can also include storing $d_0$ in the sensing circuitry 450-1 and shifting $d_0$ from sensing circuitry 450-1 to sensing circuitry 450-0, to align $d_0$ and $a_0$ in a same simulated sense line 405-0. Once aligned, the sensing circuitry 450-0 and/or the sensing circuitry 450-1 can perform $a_0$ OR $d_0$. In a number of examples, each OR operation is completed before a subsequent OR operation is performed on a particular one of sensing circuitry 451. For example, a first OR operation can be completed before a second OR operation is performed on sensing circuitry 450-0.

In at least one embodiment, an OR operation can be performed on bit-vectors a and c as well as on b and d. For example, an OR operation can be performed on a first bit of each of bit-vectors a and c, along with the second, third, and fourth bits of each of bit-vectors a and c, respectively. In addition, an OR operation can be performed on a first bit of each of bit-vectors b and, along with the second, third, and fourth bits of each of bit-vectors b and d. Performing $a_0$ OR $c_0$ and $b_0$ OR $d_0$ in memory array 430-A can be faster as compared to performing $a_0$ OR $c_0$ and $b_0$ OR $d_0$ in a physical memory array that is configured as simulated memory array 438 is configured due to the ability to perform multiple OR operations at a same time. For example, $a_0$ OR $c_0$ and $b_0$ OR $d_0$ can be performed in sensing circuitry 450-0 and 450-1, respectively, in memory array 430-A in parallel or at the same time. In contrast, however, $a_0$ OR $c_0$ and $b_0$ OR $d_0$ in memory array 438 may not be performed in parallel. For example, $a_0$ OR $c_0$ would be performed prior to performing $b_0$ OR $d_0$ as each operation would use sensing circuitry 450-0 (which would be configured as sensing circuitry 451-0 in simulated array 438) one at a time. As such, performing an operation on portions (e.g., a first bit of each bit-vector, including $a_0$, $b_0$, $c_0$, and $d_0$, respectively) of bit-vectors a, b, c, and d in memory array 430-A can be faster than performing the operation on bit-vectors a, b, c, and d in simulated memory array 438 due to the ability to use parallelism in performing the operations.

An operation can be performed on simulated array 438 by mapping the operation to an array 430-A and performing the operation on array 430-A. For example, a load operation that stores a bit, that is stored in a memory cell coupled to a simulated access line i (e.g., a simulated access line from simulated access lines 437), in a simulated sensing circuitry 451 can be mapped to an array 430-A by storing a bit, stored in memory cells coupled to access line $\lfloor i/2 \rfloor$, in sensing circuitry 450 and shifting the bit by i mod 2 sensing circuitries. The brackets "$\lfloor \: \rfloor$" represent a floor function that designates rounding a value downward to the largest integer less than or equal to the value. For example, a simulated access line i (e.g., simulated access lines 437) can be mapped to access line $\lfloor i/2 \rfloor$.

For example, mapping a load operation performed on the $a_0$ bit (e.g., loading the $a_0$ into simulated sensing circuitry 451-0) that is stored in a memory cell coupled to simulated access line 437-0 and simulated sense line 435-0 in simulated array 438 to physical array 430-A can include mapping simulated access line 437-0 to (e.g., i=0) access line 404-0 (e.g., $\lfloor 0/2 \rfloor$=0). Loading the $a_0$ bit can include storing the $a_0$ bit, that is stored in a memory cell coupled to simulated sense line 435-0 and to simulated access line 437-0 (e.g., access line i=0), in simulated sensing circuitry 451-0 by storing the $a_0$ bit, that is stored in a memory cell coupled to sense line 405-0 and access line 404-0 (e.g., access line $\lfloor 0/2 \rfloor$=0) in array 430-A to sensing circuitry 450-0 and performing a shift operation on the $a_0$ bit to move the $a_0$ bit zero sensing circuitries (e.g., 0 mod 2=0).

Loading the $a_1$ bit can include storing the $a_1$ bit, that is stored in a memory cell coupled to simulated sense line 435-1 and to simulated access line 437-0 (e.g., access line i=0), into simulated sensing circuitry 451-1 by storing the $a_1$ bit, that is stored in a memory cell coupled to sense line 405-2 and access line 404-0 (e.g., access line $\lfloor 0/2 \rfloor$=0) in array 430-A to sensing circuitry 450-2 and performing a shift operation on the $a_1$ bit to move the $a_1$ bit zero sensing circuitries (e.g., 0 mod 2=0).

The $b_0$ bit that is stored in a memory cell coupled to simulated sense line 435-0 and to simulated access line 437-1 (e.g., access line i=1) in simulated array 438 can be stored in simulated sensing circuitry 451-0 by storing the $b_0$ bit that is stored in a memory cell coupled to sense line 405-1 and access line 404-0 (e.g., access line $\lfloor 1/2 \rfloor$=0) in array 430-A to sensing circuitry 450-1 and shifting the $b_0$ bit from sensing circuitry 450-1 to sensing circuitry 450-0. For example, the $b_0$ bit can be left shifted one sensing circuitry (e.g., shift by 1 mod 2=1) from sensing circuitry 450-1 to sensing circuitry 450-0.

The $b_1$ bit that is stored in a memory cell coupled to simulated sense line 435-1 and to simulated access line 437-1 (e.g., access line i=1) in simulated array 438 can be stored in simulated sensing circuitry 451-1 by storing the $b_1$ bit that is stored in a memory cell coupled to sense line 405-3 and access line 404-0 (e.g., access line $\lfloor 1/2 \rfloor$=0) in array 430-A to sensing circuitry 450-3 and shifting the $b_1$ bit from sensing circuitry 450-3 to sensing circuitry 450-2. For example, the $b_1$ bit can be left shifted one sensing circuitry (e.g., shift by 1 mod 2=1) from sensing circuitry 450-3 to sensing circuitry 450-2.

The $c_0$ bit that is stored in a memory cell coupled to simulated sense line 435-0 and to simulated access line 437-2 (e.g., access line i=2) in simulated array 438 can be stored in simulated sensing circuitry 451-0 by storing the $c_0$ bit that is stored in a memory cell coupled to sense line 405-0 and access line 404-1 (e.g., access line $\lfloor 2/2 \rfloor$=1) in array 430-A to sensing circuitry 450-0 and performing a shift operation to move the $c_0$ bit zero sensing circuitries (e.g., 2 mod 2=0).

The $c_1$ bit that is stored in a memory cell coupled to simulated sense line 435-1 and to simulated access line 437-2 (e.g., access line i=2) in simulated array 438 can be stored in simulated sensing circuitry 451-1 by storing the $c_1$ bit that is stored in a memory cell coupled to sense line 405-2 and access line 404-1 (e.g., access line $\lfloor 2/2 \rfloor$=0) in array 430-A to sensing circuitry 450-2 and performing a shift operation to move the $c_1$ bit zero sensing circuitries (e.g., 2 mod 2=0), or, put another way, not shifting the $c_1$ bit.

The $d_0$ bit that is stored in a memory cell coupled to simulated sense line 435-0 and to simulated access line 437-3 (e.g., access line i=3) in simulated array 438 can be stored in simulated sensing circuitry 451-0 by storing the $d_0$ bit that is stored in a memory cell coupled to sense line 405-1 and access line 404-1 (e.g., access line $\lfloor 3/2 \rfloor$=1) in array 430-A to sensing circuitry 450-1 and shifting the $d_0$ bit from sensing circuitry 450-1 to sensing circuitry 450-0. For example, the $d_0$ bit can be left shifted one sensing circuitry (e.g., shift by 3 mod 2=1) from sensing circuitry 450-1 to sensing circuitry 450-0.

The $d_1$ bit that is stored in a memory cell coupled to simulated sense line 435-1 and to simulated access line 437-3 (e.g., access line i=3) in simulated array 438 can be stored in simulated sensing circuitry 451-1 by storing the $d_1$ bit that is stored in a memory cell coupled to sense line 405-3 and access line 404-1 (e.g., access line $\lfloor 3/2 \rfloor$=0) in array 430-A to sensing circuitry 450-3 and shifting the $d_1$ bit from sensing circuitry 450-3 to sensing circuitry 450-2. For example, the $d_1$ bit can be left shifted one sensing circuitry (e.g., shift by 3 mod 2=1) from sensing circuitry 450-3 to sensing circuitry 450-2.

A store operation can move a bit from a sensing circuitry to a memory cell in an array. In a number of examples, a bit can be moved from a simulated sensing circuitry 451 to a memory cell to store a result of an operation performed by simulated sensing circuitry 451. Mapping a store operation performed in a simulated array 438 to a store operation performed in array 430-A can include performing an additional shift operation to perform a store operation in array 430-A as compared to a store operation in simulated array 438. Moving (e.g., storing) a bit from a simulated sensing circuitry 451 to a memory cell coupled to a simulated sense line 435 and a simulated access line 437 can include shifting a bit stored in a sensing circuitry 450 by i mod 2 and moving the shifted bit to a memory cell coupled to access line $\lfloor i/2 \rfloor$.

For example, moving the $a_0$ bit from simulated sensing circuitry 451-0 to a memory cell coupled to simulated sensing line 435-0 and simulated access line 437-0 (e.g., i=0) can include shifting the $a_0$ bit that is stored in sensing circuitry 450-0 by zero sensing circuitries (e.g., 0 mod 2=0) and moving the $a_0$ bit to a memory cell coupled to access line 404-0 (e.g., $\lfloor 0/2 \rfloor$=0) and sense line 405-0. For example, the $a_0$ bit is not left shifted before it is stored in the memory cell coupled to access line 404-0.

Moving the $a_3$ bit from simulated sensing circuitry 451-3 to a memory cell coupled to simulated sensing line 435-3 and simulated access line 437-0 (e.g., i=0) can include right shifting the $a_3$ bit that is stored in sensing circuitry 450-6 zero sensing circuitries (e.g., 0 mod 2=0) and moving the $a_3$ bit to a memory cell coupled to access line 404-0 (e.g., $\lfloor 0/2 \rfloor$=0) and sense line 405-6.

Moving the $d_0$ bit from simulated sensing circuitry 451-0 to a memory cell coupled to simulated sensing line 435-0 and simulated access line 437-3 (e.g., i=3) can include right shifting the $d_0$ bit that is stored in sensing circuitry 450-0 one sensing circuitry (e.g., 3 mod 2=1) to sensing circuitry 450-1 and moving the $d_0$ bit to a memory cell coupled to access line 404-1 (e.g., $\lfloor 3/2 \rfloor$=1) and sense line 405-1.

A logical operation such as an AND, OR, and/or XOR operation, among other logical operations, can be mapped to memory array 430-A. Performing a logical operation in simulated memory array 438 can include performing an operation on two bits that are stored in a same sensing circuitry without shifting the bits from one sensing circuitry to a different censing circuitry. For example, performing a logical operation on $a_0$ and $b_0$ in simulated memory array 438 can include performing the logical operation on the $a_0$ bit and the $b_0$ bit which are stored in the simulated sensing circuitry 451-0 without shifting the $a_0$ bit and/or the $b_0$ bit.

Mapping the logical operation to memory array 430-A can include shifting (e.g., left shift operation) a first bit from a first sensing circuitry to a second sensing circuitry that is i mod 2 sensing circuitries from the first sensing circuitry, performing the logical operation on a second bit stored in a memory cell coupled to a particular access line (e.g., access line $\lfloor i/2 \rfloor$) and the shifted first bit in the second sensing circuitry, and shifting (e.g., right shift operation) the result bit of the logical operation by i mod 2 sensing circuitries to the first sensing circuitry. The variable i is equal to an index associated with the simulated access line 437 in which the first bit was originally stored. The first bit can be shifted before performing the logical operation to align the first bit with the second bit. The first bit is shifted after performing the logical operation to return the result of the logical operation to a sense line that is coupled to a memory cell that stores the first bit.

For example, ORing $a_0$ and $b_0$ in simulated array 438 can be mapped to memory array 430-A by determining that the $b_0$ bit is stored in a memory cell coupled to simulated access line 437-1 with an index equal to one (e.g., i=1). Mapping an OR operation can also include left shifting the $b_0$ bit that is stored in sensing circuitry 450-1 to sensing circuitry 450-0 which is one (e.g. 1 mod 2=0) sensing circuitries from sensing circuitry 450-1. Mapping the OR operation can also include performing an OR operation on $a_0$ which is stored in a memory cell coupled to access line 404-0 (e.g., access line $\lfloor 0/2 \rfloor = 0$) and $b_0$ which is stored in sensing circuitry 450-0. Mapping the OR operation can also include right shifting the result bit of the OR operation from sensing circuitry 450-0 to sensing circuitry 450-1 which is one (e.g. 1 mod 2=0) sensing circuitry from sensing circuitry 450-0.

ORing $c_3$ and $d_3$ in simulated array 438 can be mapped to memory array 430-A by, determining that the $d_3$ bit was originally stored in a memory cell coupled to simulated access line 437-3 with an index equal to three (e.g., i=3). Mapping an OR operation can also include left shifting the $b_3$ bit that is stored in sensing circuitry 450-7 to sensing circuitry 450-6 which is one (e.g. 3 mod 2=1) sensing circuitries from sensing circuitry 450-7. Mapping the OR operation can also include performing an OR operation on $c_3$ which is stored in a memory cell coupled to access line 404-1 (e.g., access line $\lfloor 3/2 \rfloor = 1$) and $d_3$ which is stored in sensing circuitry 450-6. Mapping the OR operation can also include right shifting the result bit of the OR operation from sensing circuitry 450-6 to sensing circuitry 450-7 which is one (e.g. 3 mod 2=1) sensing circuitry from sensing circuitry 450-6.

A shift operation performed on simulated memory array 438 can be mapped to memory array 430-A based on how the simulated sense lines 435 are mapped to the sense lines 405. If the pairs of adjacent sense lines 405 are joined to emulate a single simulated sense line 435 as shown in FIG. 4A, then shifting a bit from a first simulated sensing circuitry to a second simulated sensing circuitry that is n simulated sensing circuitries from the first simulated sensing circuitry can be mapped to memory array 430-A by shifting a bit from a first sensing circuitry to a second sensing circuitry that is n*j sensing circuitries from the first sensing circuitry. The variable j can refer to a set distance of sense lines between associated bits in different bit-vectors. In a number of examples, the shifting circuitry associated with array 430-A can be modified to accommodate the mapping of sense lines 405 and simulated sense lines 435. For example, the shift circuitry may not connect adjacent sensing circuitries, but may connect every other adjacent sensing circuitry and/or may employ a different connecting scheme.

Loading, storing, and performing logical operations can include shifting left and/or right. Shifting left and/or right is used herein to denote shifting towards a most significant bit (MSB) and/or a least significant bit (LSB), respectively. However, the meaning of a left shift and/or right shift can change as the placement of the MSB and/or the LSB changes within a memory array.

In a number of examples, storing data into the memory array 430-A and/or reading data from the memory array 430-A can be based on a mapping between the simulated sense lines 435 and the sense lines 405. For example, an instruction to store a bit-vector into a simulated sense line in simulated memory array 438 can be received from host 110 at controller 140. Controller 140 can distribute the bits from the bit-vector into a number of sense lines 405 that are joined to emulate the simulated sense line. If a bit-vector is received with instructions to store the bit-vector in memory cells that are coupled to simulated sense lines 435-0 to 435-3 and simulated access lines 437-0 to 437-3, then the controller 140 can store the bit-vector in memory cells coupled to sense lines 405-0 to 405-7 and access lines 404-0 to 404-1 as shown in FIG. 4A.

The simulated sense lines 435 can be mapped to sense lines 405. For example, simulated sense line 435 with indexes or indices equal to m, m+1, . . . m+3 can be mapped to sense lines 405 with an index equal to m, m+2, . . . , m+6. In FIG. 4A, simulated sense line 435-0 with an index equal to zero (e.g., m=0) can be mapped to sense line 405-0 with an index equal to zero (e.g., m=0). A simulated sense line 435-1 with an index equal to one (e.g., m+1=1) can be mapped to sense line 405-2 with an index equal to two (e.g., m+2=2).

Reading a bit-vector from memory cells coupled to a number of sense lines in memory array 430-A can include compressing the bits of a bit-vector. Compressing the bits of a bit-vector can include reading a number of portions of the bit-vector and combining the number of portions of the bit-vector into a single bit-vector. For example, the controller 140 can read the b bit-vector by reading a first portion (e.g., $b_0$) of the b bit-vector, a second portion (e.g., $b_1$) of the b bit-vector, a third portion (e.g., $b_2$) of the b bit-vector, and a fourth portion (e.g., $b_3$) of the b bit-vector. The controller 140, can then combine the first portion, the second portion, the third portion, and the fourth portion of the b bit-vector to create the b bit-vector (e.g., $b_0$, $b_1$, $b_2$, $b_3$). The controller 140 can then provide the b bit-vector to a device that requested the b bit-vector such as host 110.

Although the examples provided in FIGS. 4A and 4B are given with regard to performing operations on a bit and/or on a pair of bits, the operations can be performed an a number of bits and/or pair of bits from a plurality of bit-vectors in parallel. For example, shifting a first bit-vector from a simulated sense line 435 to a second simulated sense line 435 can include shifting portions of the first bit-vector that is stored in memory cells coupled to a same access line 404 in parallel. For example, shifting the b bit-vector can include shifting $b_0$, $b_1$, $b_2$, $b_3$ in parallel from sensing circuitry 450-1, 450-3, 450-5, 450-7, to sensing circuitry 450-0, 450-2, 450-4, 450-6.

In a number of examples, the controller 140 in FIG. 1 can be further configured to provide separate function control bits for different portions of the first number of sense line and the second number of sense lines. For example, the controller 140 can be configured to activate one and/or a portion of the sense lines 405 without activating all of the sense lines 405. The controller 140 can activate the different portions of the sense lines independently via the number of separate function control bits.

FIG. 4B illustrates tables showing a simulated memory array 438 and a physical memory array 430-B in accordance with a number of embodiments of the present disclosure. Memory array 430-B includes sense lines 405-0, 405-1, 405-2, 405-3, 405-4, 405-5, 405-6, 405-7 (e.g., referred to generally as sense lines 405) that are analogous to sense lines 405 and 305 in FIGS. 3 and 4A, access lines 404-0, 404-1 (e.g., referred to generally as access lines 404) that are analogous to access lines 304 and 404 in FIGS. 3 and 4A respectively, and sensing circuitry 450-0, 450-1, 450-2, 450-3, 450-4, 450-5, 450-6, 450-7 (e.g., referred to generally as sensing circuitry 450) that are analogous to sense amplifiers 306 and compute components 331 in FIG. 3. Simulated array 438 includes simulated sense lines 435-0, 435-1, 435-2, 435-3 (e.g., referred to generally as simulated sense lines 435), simulated access lines 437-0, 437-1, 437-2, 437-3 (e.g., referred to generally as simulated access lines 437), and simulated sensing circuitry 451-0, 451-1, 451-2, 451-3 (e.g., referred to generally as simulated sensing circuitry 451) which are analogous to simulated sense lines 435, simulated access lines 437, and simulated sensing circuitry 451 in FIG. 4A, respectively.

Emulating array 438 can include dividing the sense lines 405 of the memory array 430-B into a number of equal-sized groups and combining each of the equal size groups of sense lines 405 into a single logical simulated sense line. For example, sense lines 405 can be divided into four equal groups. The first group of sense lines can include sense lines 405-0, 405-2. The second group of sense lines can include sense lines 405-1, 405-3. The third group of sense lines can include sense lines 405-4, 405-6. The fourth group of sense lines can include sense lines 405-5, 405-7.

The first group of sense lines can be combined to create a simulated sense line 435-0. The second group of sense lines can be combined to create a simulated sense line 435-1. The third group of sense lines can be combined to create a simulated sense line 435-2. The fourth group of sense lines can be combined to create a simulated sense line 435-3.

The equal-sized groups of sense lines 405 can be divided using control software and/or hardware. As such, bits to be stored in memory cells coupled to simulated sense line 435-0 can be stored in memory cells coupled to sense lines 405-0, 405-2, bits to be stored in memory cells coupled to simulated sense line 435-1 can be stored in memory cells coupled to sense lines 405-1, 405-3, bits to be stored in memory cells coupled to simulated sense line 435-2 can be stored in memory cells coupled to sense lines 405-4, 405-6, and bits to be stored in memory cells coupled to simulated sense line 435-3 can be stored in memory cells coupled to sense lines 405-5, 405-7.

Emulating array 438 can also include mapping simulated access lines 437 to access lines 404. Each of the simulated access lines 437 can be mapped to portions of access lines 404. For example, simulated access line 437-0 maps to a first portion of access line 404-0 that is coupled to sense lines 405-0, 405-1, 405-4, 405-5, simulated access line 437-1 maps to a second portion of access line 404-0 that is coupled to sense lines 405-2, 405-3, 405-6, 405-7, simulated access line 437-2 maps to a first portion of access line 404-1 that is coupled to sense lines 405-0, 405-1, 405-4, 405-5, and simulated access line 437-3 maps to a second portion of access line 404-1 that is coupled to sense lines 405-2, 405-3, 405-6, 405-7. For example, memory cells that store $a_0$ and $a_1$ in the simulated memory array 437 and are coupled to simulated sense lines 435-0, 435-1 and simulated access line 437-0 can be mapped to a memory cells that store $a_0$ and $a_1$ in memory array 430-B and are coupled to access line 404-0 and sense lines 405-0, 405-1.

In FIG. 4B, sense lines separated by one sense line are merged. For example, sense lines 405-0 and 405-2 are merged to emulate simulated sense line 435-0, sense lines 405-1 and 405-3 are merged to emulate simulated sense line 435-1, sense lines 405-4 and 405-6 are merged to emulate simulated sense line 435-2, and sense line 405-5 and 405-7 are merged to emulate simulated sense line 435-3.

In a number of examples, storing data into the memory array 430-B and/or reading data from the memory array 430-B can be based on a mapping between the simulated sense lines 435 and the sense lines 405. For example, an instruction to store a bit-vector into memory cells coupled to a simulated sense line in simulated memory array 438 can be received from host 110 at controller 140. Controller 140 can distribute the bits from the bit-vector into a number of sense lines 405 that are joined to emulate the simulated sense line.

If a bit-vector is received with instructions to store the bit-vector in memory cells that are coupled to simulated sense lines 435-0 to 435-3 and simulated access line 437-0, then the controller 140 can store the bit-vector in memory cells coupled to sense lines 405-0, 405-1, 405-4, 405-5 and access lines 404-0 as shown in FIG. 4B. If a bit-vector is received with instructions to store a bit-vector in memory cells that are coupled to simulated sense lines 435-0 to 435-3 and simulated access lines 437-1, then the controller 140 can store the bit-vector in memory cells coupled to sense lines 405-2, 405-3, 405-6, 405-7 and access line 404-1. If a bit-vector is received with instructions to store the bit-vector in memory cells that are coupled to simulated sense lines 435-0 to 435-3 and simulated access line 437-2, then the controller 140 can store the bit-vector in memory cells coupled to sense lines 405-0, 405-1, 405-4, 405-5 and access line 404-3. If a bit-vector is received with instructions to store the bit-vector in memory cells that are coupled to simulated sense lines 435-0 to 435-3 and simulated access line 437-3, then the controller 140 can store the bit-vector in memory cells coupled to sense lines 405-3, 405-3, 405-6, 405-7 and access line 404-3.

Storing a bit-vector (e.g., data) into simulated memory array 438 can be mapped into storing the bit-vector into memory array 430-B. Storing the a bit-vector into simulated memory array 438 can include storing the $a_0$ bit in a memory cell coupled to simulated sense line 435-0 and simulated access line 437-0, storing the $a_1$ bit in a memory cell coupled to simulated sense line 435-1 and simulated access line 437-0, storing the as bit in a memory cell coupled to simulated sense line 435-2 and simulated access line 437-0, and storing the $a_3$ bit in a memory cell coupled to simulated sense line 435-3 and simulated access line 437-0.

Storing the b bit-vector into simulated memory array 438 can include storing the $b_0$ bit in a memory cell coupled to simulated sense line 435-0 and simulated access line 437-1, storing the $b_1$ bit in a memory cell coupled to simulated sense line 435-1 and simulated access line 437-1, storing the $b_2$ bit in a memory cell coupled to simulated sense line 435-2 and simulated access line 437-1, and storing the $b_3$ bit in a memory cell coupled to simulated sense line 435-3 and simulated access line 437-1. Storing the c bit-vector into simulated memory array 438 can include storing the $c_0$ bit in a memory cell coupled to simulated sense line 435-0 and simulated access line 437-2, storing the $c_1$ bit in a memory cell coupled to simulated sense line 435-1 and simulated access line 437-2, storing the $c_2$ bit in a memory cell coupled to simulated sense line 435-2 and simulated access line 437-2, and storing the $c_3$ bit in a memory cell coupled to simulated sense line 435-3 and simulated access line 437-2. Storing the d bit-vector into simulated memory array 438 can include storing the $d_0$ bit in a memory cell coupled to simulated sense line 435-0 and simulated access line 437-3, storing the $d_1$ bit in a memory cell coupled to simulated sense line 435-1 and simulated access line 437-3, storing the $d_2$ bit in a memory cell coupled to simulated sense line 435-2 and simulated access line 437-3, and storing the $d_3$ bit in a memory cell coupled to simulated sense line 435-3 and simulated access line 437-3.

Storing the a bit-vector into memory array 430-B can include storing the $a_0$ bit in a memory cell coupled to physical sense line 405-0 and access line 404-0, storing the $a_1$ bit in a memory cell coupled to sense line 405-1 and access line 404-0, storing the $a_2$ bit in a memory cell coupled to sense line 405-2 and access line 404-0, and storing the $a_3$ bit in a memory cell coupled to sense line 405-5 and access line 404-0. Storing the b bit-vector into memory array 430-B can include storing the $b_0$ bit in a memory cell coupled to sense line 405-2 and access line 404-0, storing the $b_1$ bit in a memory cell coupled to sense line 405-3 and access line 404-0, storing the $b_2$ bit in a memory cell coupled to sense line 405-6 and access line 404-0, and storing the $b_3$ bit in a memory cell coupled to sense line 405-7 and access line 404-0.

Storing the c bit-vector into memory array 430-B can include storing the $c_0$ bit in a memory cell coupled to sense line 405-0 and access line 404-1, storing the $c_1$ bit in a memory cell coupled to sense line 405-1 and access line 404-1, storing the $c_2$ bit in a memory cell coupled to sense line 405-4 and access line 404-1, and storing the $c_3$ bit in a memory cell coupled to sense line 405-5 and access line 404-1. Storing the d bit-vector into memory array 430-B can include storing the $d_0$ bit in a memory cell coupled to sense line 405-2 and access line 404-1, storing the $d_1$ bit in a memory cell coupled to sense line 405-3 and access line 404-1, storing the $d_2$ bit in a memory cell coupled to sense line 405-6 and access line 404-1, and storing the $d_3$ bit in a memory cell coupled to sense line 405-7 and access line 404-1.

The reading of a bit-vector (e.g., data) from the simulated memory array 438 can be mapped to a reading of the bit-vector from memory array 438. For example, the controller can read the $a_0$, $a_1$, $b_0$, $b_1$, $a_2$, $a_3$, $b_2$, and $b_3$, bits at a same time by moving the $a_0$, $a_1$, $b_0$, $b_1$, $a_2$, $a_3$, $b_2$, and $b_3$ bits to the sensing circuitry 450 and moving the $a_0$, $a_1$, $b_0$, $b_1$, $a_2$, $a_3$, $b_2$, and $b_3$ bits to the controller 140, and by compressing the $a_0$, $a_1$ $a_2$, and $a_3$, bits into a bit-vector [$a_0$, $a_1$, $a_2$, $a_3$,], and the $b_0$, $b_1$, $b_2$, and $b_3$ bits into a bit-vector [$b_0$, $b_1$, $b_2$, $b_3$]. The controller can also read the $c_0$, $c_1$, $d_0$, $d_1$, $c_2$, $c_3$, $d_2$, and $d_3$ bits at a same time by moving the $c_0$, $c_1$, $d_0$, $d_1$, $c_2$, $c_3$, $d_2$, and $d_3$ bits to the sensing circuitry 450 and moving the $c_0$, $c_1$, $d_0$, $d_1$, $c_2$, $c_3$, $d_2$, and $d_3$ bits to the controller 140, and by compressing the $c_0$, $c_1$, $c_2$, and $c_3$ bits into a bit-vector [$c_0$, $c_1$, $c_2$, $c_3$], and the $d_0$, $d_1$, $d_2$, and $d_3$ bits into a bit-vector [$d_0$, $d_1$, $d_2$, $d_3$]. In a number of examples, the controller can read the $a_0$, $a_1$, $b_0$, $b_1$, $a_2$, $a_3$, $b_2$, and $b_3$, bits at a same time by moving the $a_0$, $a_1$, $b_0$, $b_1$, $a_2$, $a_3$, $b_2$, and $b_3$ bits to the sensing circuitry 450 and moving the $a_0$, $a_1$, $b_0$, $b_1$, $a_2$, $a_3$, $b_2$, and $b_3$ bits to the controller 140. The controller 140 can then isolate any one of the $a_0$, $a_1$, $b_0$, $b_1$, $a_2$, $a_3$, $b_2$, and $b_3$ bits. For example, the controller 140 can isolate the $b_3$ bit.

In the example provided in FIG. 4B, a simulated access line 437 $i$ can be mapped to an access line 404-($\lfloor i/2 \rfloor$). A simulated sense line 405 $k$ can be mapped to a sense line $$405\text{-}\left(4*\left\lfloor\frac{k}{2}\right\rfloor + (i\mathrm{mod}2)*2 + (k\mathrm{mod}2)\right).$$

An operation can be performed on simulated memory array 438 by mapping the operation to an array 430-B and performing the operation on array 430-B. For example, a load operation that stores a bit, that is stored in a memory cell coupled to a simulated access line i (e.g., a simulated access line from simulated access lines 437), in a simulated sensing circuitry 451 can be mapped to an array 430-B by storing a bit, stored in memory cells coupled to access line $\lfloor i/2 \rfloor$, in sensing circuitry 450 and shifting the bit to $$4*\left\lfloor\frac{k}{2}\right\rfloor + (i\mathrm{mod}2)*2 + (k\mathrm{mod}2)$$

sensing circuitry (e.g., sensing circuitry 450).

For example, a load operation to be performed on simulated memory array 438 can be mapped to be performed on memory array 430-B. Performing a load operation on $a_0$, $a_1$, $a_2$, and $a_3$ bits to load the $a_0$, $a_1$, $a_2$, and $a_3$ bits to simulated sensing circuitry 451 can include storing the $a_0$ bit in simulated sensing circuitry 451-0, the $a_1$ bit in simulated sensing circuitry 451-1, the $a_2$ bit in simulated sensing circuitry 451-2, and/or the $a_3$ bit in simulated sensing circuitry 451-3. The load operation performed on the $a_0$, $a_1$, $a_2$, and $a_3$ bits to load the bits to simulated sensing circuitry 451 can be mapped to load the bits to sensing circuitry 450 in memory array 430-B.

Mapping the load operation to be performed in memory array 430-B can include storing the $a_0$ bit, that is stored in a memory cell coupled to simulated sense line 435-0 (e.g., simulated sense line k=0) and to simulated access line 437-0 (e.g., simulated access line i=0), into simulated sensing circuitry 451-0 by storing the $a_0$ bit, that is stored in a memory cell coupled to sense line 405-0 (e.g., sense line $$4*\left\lfloor\frac{0}{2}\right\rfloor + (0\mathrm{mod}2)*2 + (0\mathrm{mod}2) = 0)$$

and access line 404-0 (e.g., access line $\lfloor 0/2 \rfloor$=0) in array 430-B into sensing circuitry 450-0 and shifting the $a_0$ bit to sensing circuitry 450-0. For example, the $a_0$ bit is not shifted. Mapping the load operation to be performed in memory array 430-B can include storing the $a_1$ bit, that is stored in a memory cell coupled to simulated sense line 435-1 (e.g., simulated sense line k=1) and to simulated access line 437-0 (e.g., simulated access line i=0), into simulated sensing circuitry 451-1 by storing the $b_0$ bit, that is stored in a memory cell coupled to sense line 405-1 (e.g., sense line $$4*\left\lfloor\frac{1}{2}\right\rfloor + (0\mathrm{mod}2)*2 + (1\mathrm{mod}2) = 1)$$

and access line 404-0 (e.g., access line $\lfloor 0/2 \rfloor = 0$) in array 430-B to sensing circuitry 450-1 and left shifting the $a_1$ bit zero (e.g., 2*(0 mod 2)=0) sensing circuitries (e.g., not shifting the $a_1$ bit).

Mapping the load operation to be performed in memory array 430-B can include storing the $a_2$ bit, that is stored in a memory cell coupled to simulated sense line 435-2 (e.g., simulated sense line k=2) and to simulated access line 437-0 (e.g., simulated access line i=0), into simulated sensing circuitry 451-2 by storing the $a_2$ bit, that is stored in a memory cell coupled to sense line 405-4 (e.g., sense line $$4 * \left\lfloor \frac{2}{2} \right\rfloor + (0\bmod 2) * 2 + (2\bmod 2) = 4\Big)$$

and access line 404-0 (e.g., access line $\lfloor 0/2 \rfloor = 0$) in array 430-B to sensing circuitry 450-4 and left shifting the $a_2$ bit zero (e.g., 2*(0 mod 2)=0) sensing circuitries (e.g., not shifted). Mapping the load operation to be performed in memory array 430-B can include storing the $a_3$ bit, that is stored in a memory cell coupled to simulated sense line 435-3 (e.g., simulated sense line k=3) and to simulated access line 437-0 (e.g., simulated access line i=0), in simulated sensing circuitry 451-3 by storing the $a_3$ bit, that is stored in a memory cell coupled to sense line 405-5 (e.g., sense line $$4 * \left\lfloor \frac{3}{2} \right\rfloor + (0\bmod 2) * 2 + (3\bmod 2) = 5\Big)$$

and access line 404-0 (e.g., access line $\lfloor 0/2 \rfloor = 0$) in array 430-B to sensing circuitry 450-5 and left shifting (e.g., 2*(0 mod 2)=0) the $a_3$ bit zero sensing circuitries (e.g., not shifted).

In a number of examples, the load operation can be performed on the $b_0$, $b_1$, $b_2$ and $b_3$ bits to load the bits into simulated sensing circuitry 451. The load operation performed on $b_0$, $b_1$, $b_2$ and $b_3$ can be mapped to load the bits into sensing circuitry 450 in memory array 430-B.

Mapping the load operation to be performed in memory array 430-B can include storing the $b_0$ bit, that is stored in a memory cell coupled to simulated sense line 435-0 (e.g., simulated sense line k=0) and to simulated access line 437-1 (e.g., simulated access line i=1), into simulated sensing circuitry 451-0 by storing the $b_0$ bit, that is stored in a memory cell coupled to sense line 405-2 (e.g., sense line $$4 * \left\lfloor \frac{0}{2} \right\rfloor + (1\bmod 2) * 2 + (0\bmod 2) = 2\Big)$$

and access line 404-0 (e.g., access line $\lfloor 1/2 \rfloor = 0$) in array 430-B into sensing circuitry 450-2 and left shifting the $b_0$ bit two (e.g., 2*(1 mod 2)=2) sensing circuitries from sensing circuitry 450-2 to sensing circuitry 450-0. Mapping the load operation to be performed in memory array 430-B can include storing the $b_1$ bit, that is stored in a memory cell coupled to simulated sense line 435-1 (e.g., simulated sense line k=1) and to simulated access line 437-1 (e.g., simulated access line i=1), in simulated sensing circuitry 451-1 by storing the $b_1$ bit, that is stored in a memory cell coupled to sense line 405-3 (e.g., sense line $$4 * \left\lfloor \frac{1}{2} \right\rfloor + (1\bmod 2) * 2 + (1\bmod 2) = 3\Big)$$

and access line 404-0 (e.g., simulated access line $\lfloor 1/2 \rfloor = 0$) in array 430-B, to sensing circuitry 450-3 and left shifting the $b_1$ bit two (e.g., 2*(1 mod 2)=2) sensing circuitries from sensing circuitry 450-3 to sensing circuitry 450-1.

Mapping the load operation to be performed in memory array 430-B can include storing the $b_2$ bit, that is stored in a memory cell coupled to simulated sense line 435-2 (e.g., simulated sense line k=2) and to simulated access line 437-1 (e.g., simulated access line i=1), into simulated sensing circuitry 451-2 by storing the $b_2$ bit, that is stored in a memory cell coupled to sense line 405-6 (e.g., sense line $$4 * \left\lfloor \frac{2}{2} \right\rfloor + (1\bmod 2) * 2 + (2\bmod 2) = 6\Big)$$

and access line 404-0 (e.g., access line $\lfloor 1/2 \rfloor = 0$) in array 430-B to sensing circuitry 450-6 and left shifting the $b_2$ bit two (e.g., 2*(1 mod 2)=2) sensing circuitries from sensing circuitry 450-6 to sensing circuitry 450-4. Mapping the load operation to be performed in memory array 430-B can include storing the $b_3$ bit, that is stored in a memory cell coupled to simulated sense line 435-3 (e.g., simulated sense line k=3) and to simulated access line 437-1 (e.g., simulated access line i=1), into simulated sensing circuitry 451-3 by storing the $b_3$ bit, that is stored in a memory cell coupled to sense line 405-7 (e.g., sense line $$4 * \left\lfloor \frac{3}{2} \right\rfloor + (1\bmod 2) * 2 + (3\bmod 2) = 7\Big)$$

and access line 404-0 (e.g., access line $\lfloor 1/2 \rfloor = 0$) in array 430-B into sensing circuitry 450-7 and left shifting the $b_3$ bit two (e.g., 2*(1 mod 2)=2) sensing circuitries from sensing circuitry 450-7 to sensing circuitry 450-5.

A store operation to be performed in simulated memory array 438 can be mapped to be performed in memory array 430-B. A store operation that moves (e.g., stores) a bit from a simulated sensing circuitry 451 to a memory cell coupled to a simulated sense line 435 (e.g., k) and a simulated access line 437 (e.g., i) can include shifting a bit stored in a sensing circuitry 450

$$4 * \left\lfloor \frac{k}{2} \right\rfloor + (k\bmod 2)$$

by 2*(i mod 2) sensing circuitries 450 and moving the shifted bit to a memory cell coupled to access line $\lfloor i/2 \rfloor$ and sense line $$\left(\text{e.g., } 4 * \left\lfloor \frac{k}{2} \right\rfloor + (i\bmod 2) * 2 + (k\bmod 2)\right).$$

For example, moving the $a_0$ bit from simulated sensing circuitry 451-0 to a memory cell coupled to simulated sensing line 435-0 (e.g., simulated sensing line k=0) and simulated access line 437-0 (e.g., simulated access line i=0) can include right shifting the $a_0$ bit that is stored in sensing circuitry 450-0

$$\left(e.g., 4*\left\lfloor\frac{0}{2}\right\rfloor + (0 \bmod 2) = 0\right) \text{ by zero (e.g., } 2*(0 \bmod 2) = 0\text{)}$$

to sensing circuitry 450-0 (computed from $$4*\left\lfloor\frac{0}{2}\right\rfloor + (0 \bmod 2)*2 + (0 \bmod 2)$$

and moving the shifted $a_0$ bit to a memory cell coupled to access line 404-0 (e.g., $\lfloor 0/2 \rfloor = 0$) and sense line 405-0

$$\left(e.g., 4*\left\lfloor\frac{0}{2}\right\rfloor + (0 \bmod 2)*2 + (0 \bmod 2) = 0\right).$$

Moving the $d_2$ bit from simulated sensing circuitry 451-2 to a memory cell coupled to simulated sensing line 435-2 (e.g., simulated sensing line k=2) and simulated access line 437-3 (e.g., simulated access line i=3) can include left shifting the $d_2$ bit that is stored in sensing circuitry 450-4

$$\left(e.g., 4*\left\lfloor\frac{2}{2}\right\rfloor + (2 \bmod 2) = 4\right)$$

by two sensing circuitries (e.g., 2*(3 mod 2)=2) to sensing circuitry 450-6 (e.g., sensing circuitry $$4*\left\lfloor\frac{2}{2}\right\rfloor + (3 \bmod 2)*2 + (2 \bmod 2) = 6\Big)$$

and moving the shifted $d_2$ bit into a memory cell coupled to access line 404-1 (e.g., $\lfloor 3/2 \rfloor = 2$) and sense line 405-6 (e.g., sensing circuitry $$4*\left\lfloor\frac{2}{2}\right\rfloor + (3 \bmod 2)*2 + (2 \bmod 2) = 6\Big).$$

Performing a logical operation in simulated memory array 438 can include performing the logical operation on the two bits stored in a same simulated sensing circuitry. For example, performing a logical operation on $a_0$ and $b_0$ in simulated memory array 438 can include performing the logical operation on the $a_0$ bit and the $b_0$ bit stored simulated sensing circuitry 451-0. Furthermore, the result bit stored in the sensing circuitry 451-0 and/or the different simulated sensing circuitry 451 can be stored in a memory cell coupled to a simulated sense line (e.g., simulated sense line 435-0) associated with the sensing circuitry 451-0 and/or the different simulated sensing circuitry 451.

Mapping the logical operation to memory array 430-B can include shifting (e.g., left shift operation) a first bit from a first sensing circuitry to a second sensing circuitry that is a number of sensing circuitries from the first sensing circuitry, performing the logical operation on a second bit stored in a memory cell coupled to a particular access line and the shifted first bit in the second sensing circuitry, and shifting (e.g., right shift operation) the result bit of the logical operation by the number of sensing circuitries back to the first sensing circuitry. For example, ORing $a_0$ and $b_0$ in simulated array 438 can be mapped to ORing $a_0$ and $b_0$ in memory array 430-B by determining that the $b_0$ bit was originally stored in a memory cell coupled to simulated access line 437-1 with an index equal to one. Mapping an OR operation can also include left shifting the $b_0$ bit that is stored in sensing circuitry 450-2 to sensing circuitry 450-0 which is two sensing circuitries from sensing circuitry 450-0. Mapping the OR operation can also include performing an OR operation on $a_0$ which is stored in a memory cell coupled to access line 404-0 and $b_0$ which is stored in sensing circuitry 450-0. Mapping the OR operation can also include right shifting the result bit of the OR operation from sensing circuitry 450-0 to sensing circuitry 450-2 which is two sensing circuitries from sensing circuitry 450-0.

ORing $b_3$ and $c_3$ in simulated array 438 can be mapped to ORing $b_3$ and $c_3$ in memory array 430-B by determining that the $b_3$ bit was originally stored in a memory cell coupled to simulated access line 437-1. Mapping an OR operation can also include left shifting the $b_3$ bit that is stored in sensing circuitry 450-7 to sensing circuitry 450-5 which is two sensing circuitries from sensing circuitry 450-5. Mapping the OR operation can also include performing an OR operation on $c_3$ which is stored in a memory cell coupled to access line 404-5 and $b_3$ which is stored in sensing circuitry 450-5. Mapping the OR operation can also include right shifting the result bit of the OR operation from sensing circuitry 450-5 to sensing circuitry 450-7 which is two sensing circuitries from sensing circuitry 450-5.

A shift operation performed on simulated memory array 438 can be mapped to memory array 430-B based on how the simulated sense lines 435 are mapped to the sense lines 405. If non-adjacent pairs of adjacent sense lines 405 are joined to emulate a single simulated sense line 435 as shown in FIG. 4B, then shifting a bit from a first simulated sensing circuitry to a second simulated sensing circuitry that is n simulated sensing circuitries from the first simulated sensing circuitry can be mapped to memory array 430-B by shifting a bit from a first sensing circuitry to a second sensing circuitry that is either $\lfloor n/2 \rfloor *4+1$ or $\lfloor n/2 \rfloor *4+3$ sensing circuitries from the first sensing circuitry, wherein one of the formulas is selected based on whether n is an even or odd number.

Figure 5A:
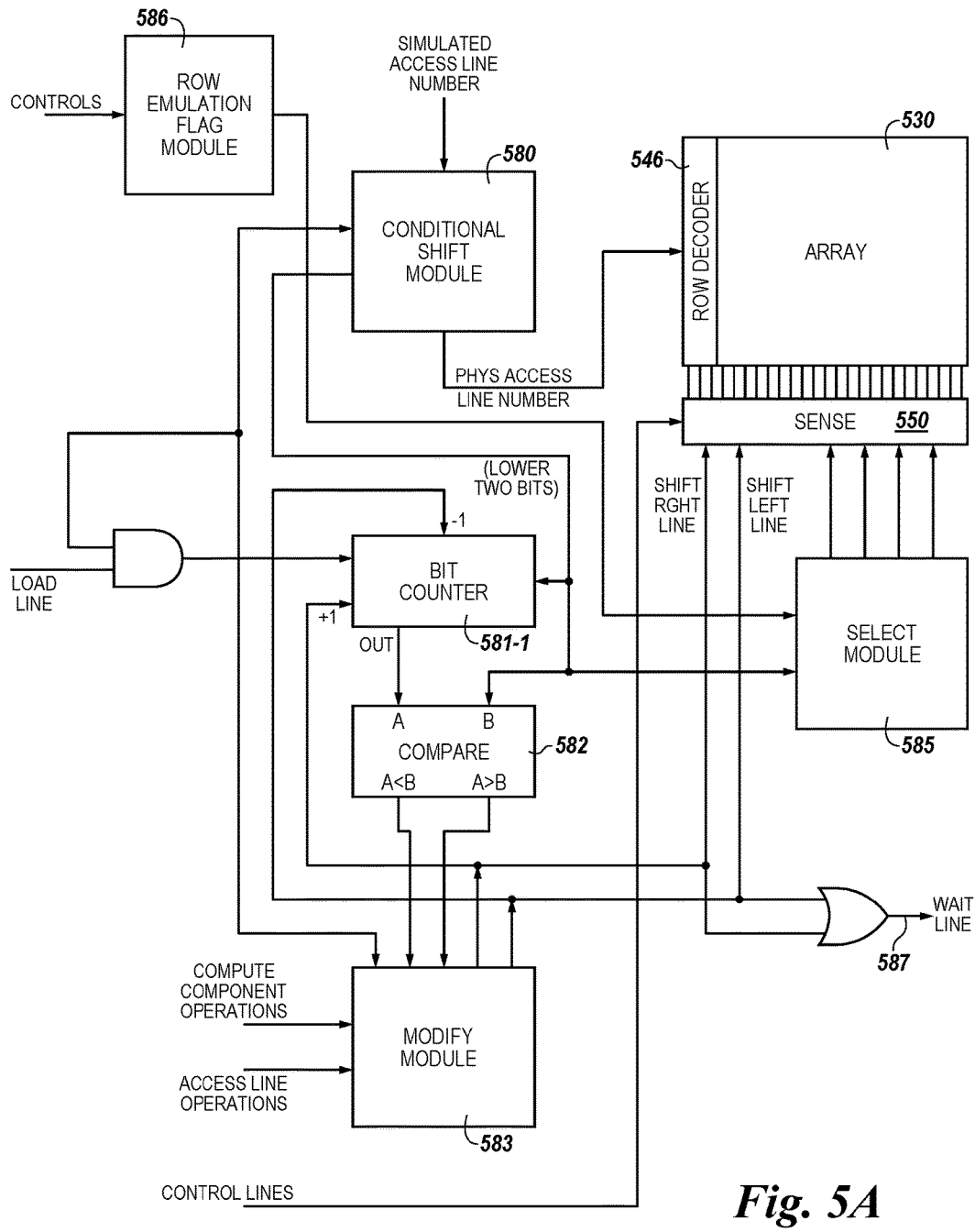
FIGS. 5A-5B illustrate a schematic diagram of a portion of a controller in accordance with a number of embodiments of the present disclosure.

FIG. 5A illustrates a schematic diagram of a portion of a controller in accordance with a number of embodiments of the present disclosure. FIG. 5A includes array 530, row decoder 546, and sensing circuitry 550, that are analogous to array 130, row decoder 146, and sensing circuitry 150 in FIG. 1. FIG. 5A also includes conditional shift module 580, bit counter 581-1, comparator 582, modify module 583, select module 585, emulation flag module 586, and wait line 587. The conditional shift module 580, bit counter 581-1, comparator 582, modify module 583, select module 585, emulation flag module 586, and wait line 587 can be used to implement the example described in association with FIG. 4A.

FIG. 5A shows a schematic diagram for multiplexing a number (n) of continuous physical sense lines into a virtual sense line. For example, four (e.g., n=4) continuous physical sense lines can be multiplexed into a virtual sense line. The circuitry shown in FIG. 5A can be included in controller 140 and/or between controller 140 and array 130 in FIG. 1.

The emulation flag module 586 can determine whether the simulated access lines are being emulated. The emulation flag module 586 can be coupled to the conditional shift module 580, the modify module 583, the select module 585, and the bit counter 581-1. The emulation flag module 586 can activate (e.g., 1) or deactivate (e.g., 0) an emulation flag to signify whether a number of simulated access lines are emulated using physical access lines. The emulated flag module 586 can be used to select from multiple emulation modes such as mappings and/or row emulation rations.

Conditional shift module 580 can receive a simulated access line number associated with a particular access line. The conditional shift module 580 can also receive a simulation flag that can identify whether access line and sense line emulation is activated (e.g., turned on). The conditional shift module 580 can map the simulated access line number to a physical access line number. The conditional shift module 580 can be coupled to the row decoder 546, the select module 585, the comparator 582, and/or the emulation flag module 586. The simulated access line number received by the conditional shift module 580 can identify a simulated access line and a physical access line on which an operation is performed.

If the emulated access flag is activated, then the simulated access line number that identifies a simulated access line can be mapped by the conditional shift module 580 to the physical access line number that identifies the physical access line. If the emulated access flag is deactivated, then the conditional shift module 580 can forward the received simulated access line number as a physical access line number.

The conditional shift module 580 can map the simulated access line number to the physical access line number by shifting the simulated access line number, for example. In a number of examples, the mapping can include performing other operations.

The conditional shift module 580 can also provide a number of least significant bits of the simulated access line number to the bit counter 581-1 and/or the comparator 582. The quantity of least significant bits provided to the bit counter 581-1 and/or the comparator 582 can depend on the mapping employed by the conditional shift module 580.

The bit counter 581-1 can be a two bit counter, a three bit counter, or a counter with a greater number of bits. The bit counter 581-1 can also be a ring counter and/or a non-binary counter, among other counter types. The bit counter 581-1 can be used to map a simulated sensing circuitry to a physical sensing circuitry. The bit counter 581-1 can initially be set to zero and can be incremented or decremented based on the result of the modify module 583 which are represented via a shift right line and/or a shift left line. For example, a result provided by the modifier module 583 via the shift right line can increment the bit counter 581-1 and a result provided by the modifier module 583 via the shift left line can decrement the bit counter 581-1. The bit counter can provide the current shift amount to the comparator 582 (e.g., A). The bit counter can be reset via a load line that identifies whether a load operation has been performed.

The comparator 582 can receive the current shift amount (e.g., A) and a number of least significant bits (e.g., B) of a simulated access line number. The comparator can determine whether A is less than B or whether B is less than A. Determining whether A is less than B or whether B is less than A can identify which compute component coupled to a physical sense line of the physical sense lines that are representing a simulated sense line is associated with the virtual compute component. The comparator can accordingly provide the results of the determination to the modify module 583.

The modify module 583 can receive an indication that A is less than B or B is less than A. The modify module 583 can also receive an indication of the type of operation being performed. The modifier module 583 can modify the results of the comparator such that the content of the compute components is shifted to a more significant bit (e.g., shift left line) and/or a less significant bit (e.g., shift right line) based on the type of operation being performed in the sensing circuitry 550, the result of the comparator 582, and emulation flag. The type of operations being performed can include, among other examples, operations that store data to the compute components and/or operations that store data to memory cells coupled to a physical access line identified by a simulated access line number.

The selector module 585 receives the emulation flag and a number of least significant bits from the simulated access line number. The selector module can identify which of the compute components are associated with an operation before the content of the compute components is shifted in the sensing circuitry 550.

A wait line 587 can request that the controller 140 in FIG. 1 repeat a last operation or to provide a next operation. As such, the wait line 587 can be activated (e.g., request to repeat a last operation) if a shift operation is performed, if data stored in the compute components is shifted in association with performing an operation, and/or if data is shifted in association with mapping an operation performed in a simulated array to an operation performed in array 530. The sensing circuitry 550 can also receive a number of other control lines that can define a number of operations performed in the sensing circuitry 550.

Figure 5B:
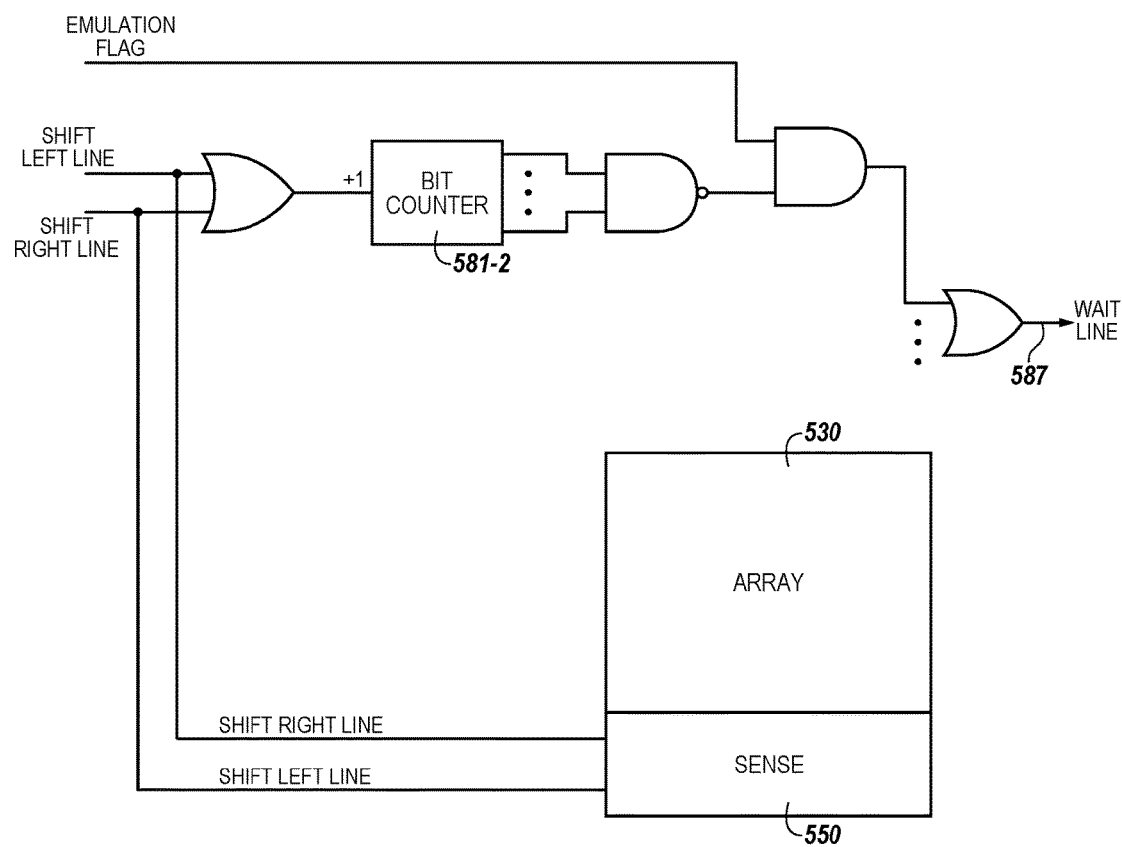

FIG. 5B illustrates a schematic diagram of a portion of a controller in accordance with a number of embodiments of the present disclosure. FIG. 5B includes array 530 and sensing circuitry 550, that are analogous to array 130, row decoder 146, and sensing circuitry 150 in FIG. 1 and array 530 and sensing circuitry 550 in FIG. 5A. FIG. 5B also includes an emulation flag, a shift left line, a shift right line, a wait line 587 which is analogous to wait line 587 in FIG. 5A and bit counter 581-2.

FIG. 5B shows a schematic diagram for performing a shift operation. The circuitry shown in FIG. 5B can be included in controller 140 and/or between controller 140 and array 130 in FIG. 1.

The shift left line and/or the shift right line can control a shift operation performed in the sensing circuitry 550. The shift left line and the shift right line can indicate a shift operation towards a MSB and/or a LSB, respectively. The shift left line and/or the shift right line in FIG. 5B can be coupled to the shift left line and/or the shift right line in FIG. 5A.

The schematic diagram can map a shift operation performed in a simulated array to a shift operation performed in array 530. For example, a shift operation performed in a simulated array can include shifting the bits stored in a simulated compute component once. Mapping the shift operation in a simulated array to a shift operation in array 530 can include shifting the bits stored in the compute components a plurality of times. The example provided in FIG. 5B shifts the bits stored in the compute components a plurality of times via a wait line 587. The wait line 587 indicates to a controller 140 that the last operation shall be repeated. For example, if the wait line 587 is activated, then a last shift operation is repeated. If the wait line 587 is not activated then a controller 140 can provide a next instruction.

The shift left line and/or the shift right line in FIG. 5B can be controlled by the controller 140 and/or by the modify module 583. For example, the shift left line and/or the shift right line can be activated independently from the modify module 583. For example, the shift left line can be activated to perform a shift operation towards a MSB and the shift right line can be activated to perform a shift operation towards a LSB.

The bit counter 581-2 can be incremented every time that a shift left line and/or a shift right line is activated. The bit counter 581-2 can be a two bit counter or a three bit counter, among other types of bit counters. The bit counter 581-2 may only have increment functionality. The bit counter 581-2 can determine how many times the shift operation is repeated and as such can determine a mapping between a shift operation performed on a simulated array and a shift operation performed on array 530. For example, a two bit counter can be used to perform four shift operations in array 530 for every shift operation performed in a simulate array. A three bit counter can be used to perform a number of shift operations up to eight shift operations, such as six shift operations, in array 530 for every shift operation performed in simulated array.

The bit counter 581-2 can be coupled to a NAND gate to determine when to activate the wait line 587. The NAND gate can be used to indicate to the controller 140 to provide a next operation when the bit counter 581-2 provides all 1-bits or to repeat a last operation (e.g., shift operation) when the bit counter 581-2 does not provide all 1-bits. The wait line 587 can be activated when the emulation flag is activated and the bit counter 581-2 does not output all 1-bits. The bit counter 581-2 can map bits to a count. The maximum quantity of 1-bits provided by the bit counter 581-2 can be determined by a type of bit counter that is associated with bit counter 581-2. For example, if the bit counter 581-2 is a two bit counter, then the maximum quantity of 1-bits can be four. If the bit counter 581-2 is a three bit counter, then the maximum quantity of 1-bits can be six. In a number of examples, the bit counter 581-2 can be reset every time the wait line 587 indicates to the controller 140 that a new operation can be provided.

Figure 6A:
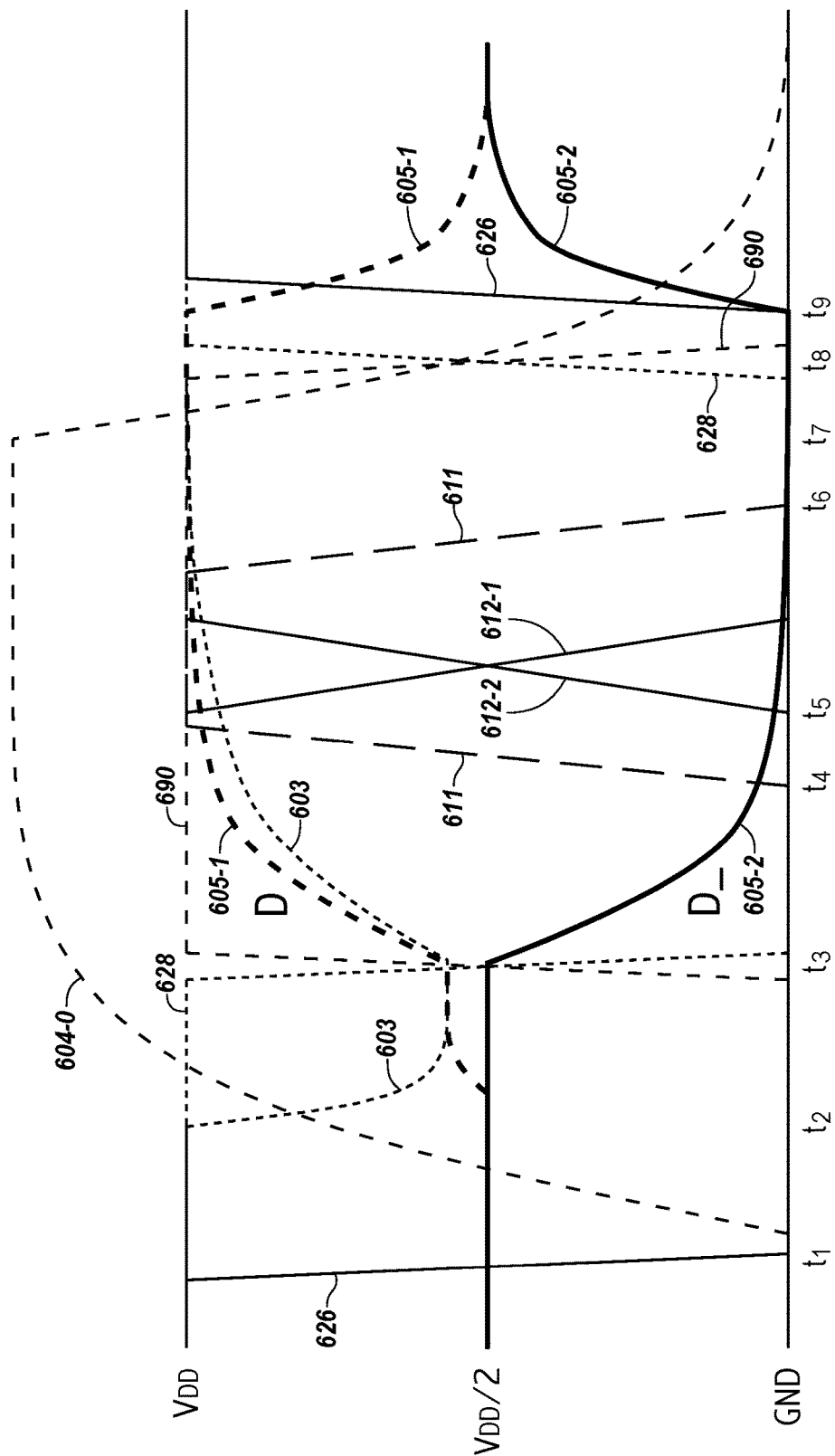
FIGS. 6A-6D illustrate timing diagrams associated with performing a number of logical operations using sensing circuitry in accordance with a number of embodiments of the present disclosure.

FIG. 6A illustrates a timing diagram associated with performing a number of logical operations using sensing circuitry in accordance with a number of embodiments of the present disclosure. The functionality of the sensing circuitry 250-2 of FIG. 2A is described below with respect to performing logical operations and initially storing a result in the compute component 231-2 (e.g., secondary latch of the accumulator). The timing diagram shown in FIG. 6A illustrates signals (e.g., voltage signals) associated with performing a first operation phase of a logical operation (e.g., an R-input logical operation) using the sensing circuitry illustrated in FIG. 2A. The first operation phase described with respect to FIG. 6A can be a first operation phase of an AND, NAND, OR, or NOR operation, for instance. Performing the operation phase illustrated in FIG. 6A can involve consuming significantly less energy (e.g., about half) than previous processing approaches that may involve providing a full swing between voltage rails (e.g., between a supply and ground for accessing I/O lines).

In the example illustrated in FIG. 6A, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 6A $d_0$ not necessarily represent a same absolute or relative time as similar time references in other timing diagrams.

At time $t_1$, the equilibration signal 626 is deactivated, and then a selected row is enabled (e.g., the row corresponding to a memory cell whose data value is to be sensed and used as a first input). Signal 604-0 represents the voltage signal applied to the selected row (e.g., Row 204-Y shown in FIG. 2A). When row signal 604-0 reaches the threshold voltage (Vt) of the access transistor (e.g., 202-3 shown in FIG. 2A) corresponding to the selected cell, the access transistor turns on and couples the data line D to the selected memory cell (e.g., to the capacitor 203-3 shown in FIG. 2A if the cell is a 1T1C DRAM cell), which creates a differential voltage signal between the data lines D and D_ (e.g., as indicated by signals 605-1 and 605-2 on the data lines, respectively) between times $t_2$ and $t_3$. The voltage of the selected cell is represented by signal 603. Due to conservation of energy, creating the differential signal between data lines D and D_ (e.g., by coupling the cell to data line D) does not consume energy. However, the energy associated with enabling/disabling the row signal 604-0 is distributed over the plurality of memory cells coupled to the row.

At time $t_3$, the sense amplifier (e.g., 206-2 shown in FIG. 2A) is enabled. As shown, a positive control signal 690, e.g., corresponding to ACT 265 shown in FIG. 2B, goes high and the negative control signal 628, e.g., corresponding to RnIF 228 shown in FIG. 2B, goes low. This amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_). As such, the sensed data value is stored in the primary latch of sense amplifier 206-2. The primary energy consumption occurs in charging the data line D (205-1) from the equilibration voltage $V_{DD}/2$ to the rail voltage $V_{DD}$. FIG. 6A shows, in example, the data line voltages 605-1 and 605-2 that correspond to a logic "1" being on data line D.

According to some embodiments, the primary latch of sense amplifier 206-2 can be coupled to the complementary data lines D and D_ through respective pass transistors (not shown in FIG. 2A but in a similar configuration as the manner in which latch 264 is coupled to the data lines D and D_ through load/pass transistors 218-1 and 218-2 shown in FIG. 2A). The PASSD control signal 611 controls one pass transistor. The PASSDB control signal controls the other pass transistor, and here the PASSDB control signal can behave here the same as the PASSD control signal.

At time $t_4$, the pass transistors (if present) can be enabled (e.g., via respective PASSD and PASSDB control signals 611 applied to control lines coupled to the respective gates of the pass transistors going high). At time $t_5$, the accumulator negative control signal 612-1 (e.g., Accumb) and the accumulator positive control signal 612-2 (e.g., Accum) are activated via respective control lines 212-1 and 212-2 shown in FIG. 2A. As described below, the accumulator control signals ACCUMB 612-1 and ACCUM 612-2 may remain activated for subsequent operation phases. As such, in this example, activating the control signals ACCUMB 612-1 and ACCUM 612-2 enables the secondary latch (e.g., accumulator) of compute component 231-2 shown in FIG. 2A. The sensed data value stored in sense amplifier 206-2 is transferred (e.g., copied) to the secondary latch, including the dynamic latch and static latch 264, as shown in FIG. 2A.

At time $t_6$, the PASSD control signal 611 (and the PASSDB control signal) goes low thereby turning off the pass transistors (if present). However, since the accumulator control signals ACCUMB 612-1 and ACCUM 612-2 remain activated, an accumulated result is stored (e.g., latched) in the secondary latches (e.g., accumulator). At time $t_7$, the row signal 604-0 is deactivated, and the array sense amplifiers are disabled at time $t_8$ (e.g., sense amplifier control signals 628 and 690 are deactivated).

At time $t_9$, the data lines D and D_ are equilibrated (e.g., equilibration signal 626 is activated), as illustrated by data line voltage signals 605-1 and 605-2 moving from their respective rail values to the equilibration voltage ($V_{DD}/2$). The equilibration consumes little energy due to the law of conservation of energy. As described above in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 6B:
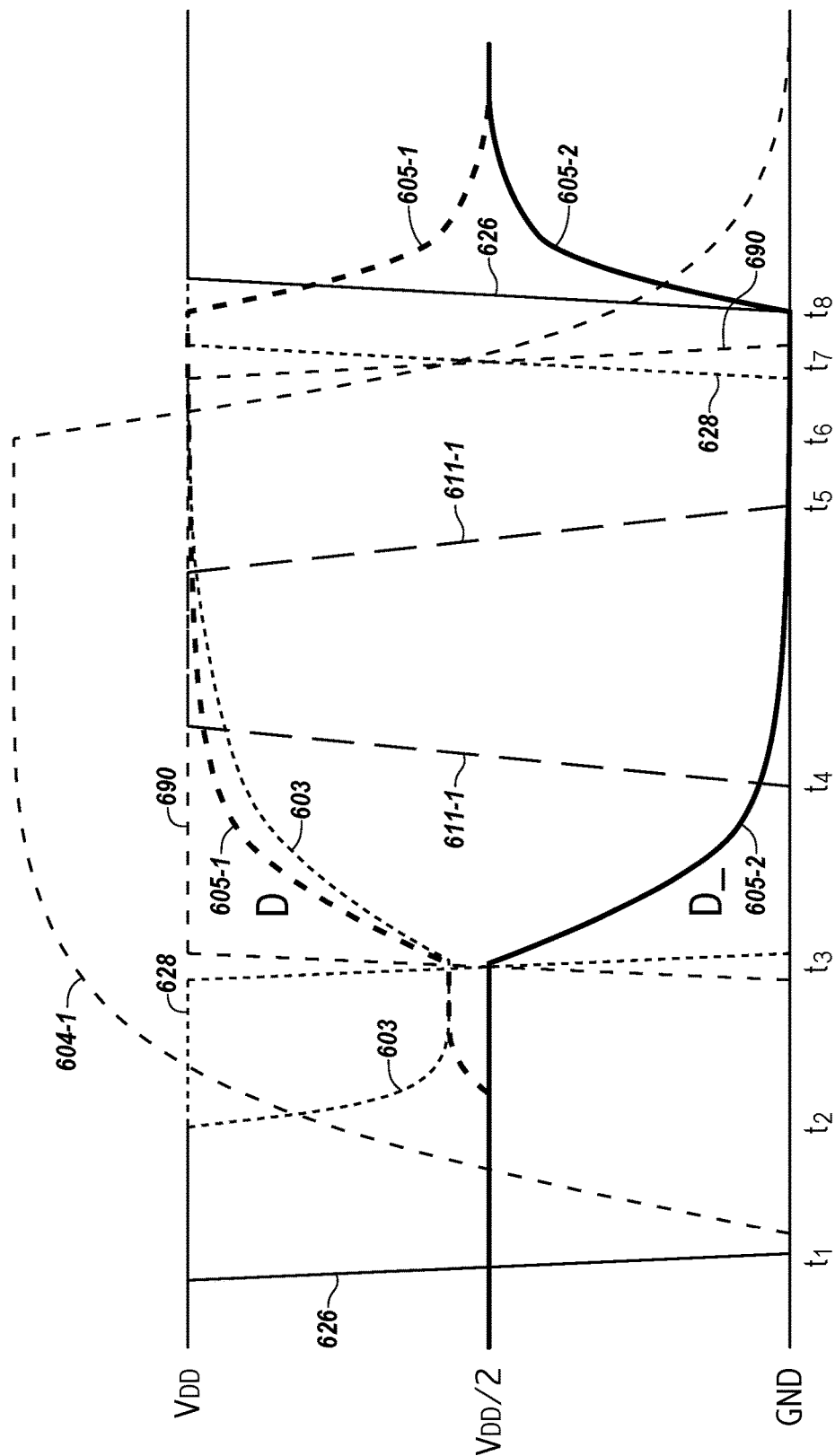
Figure 6C:
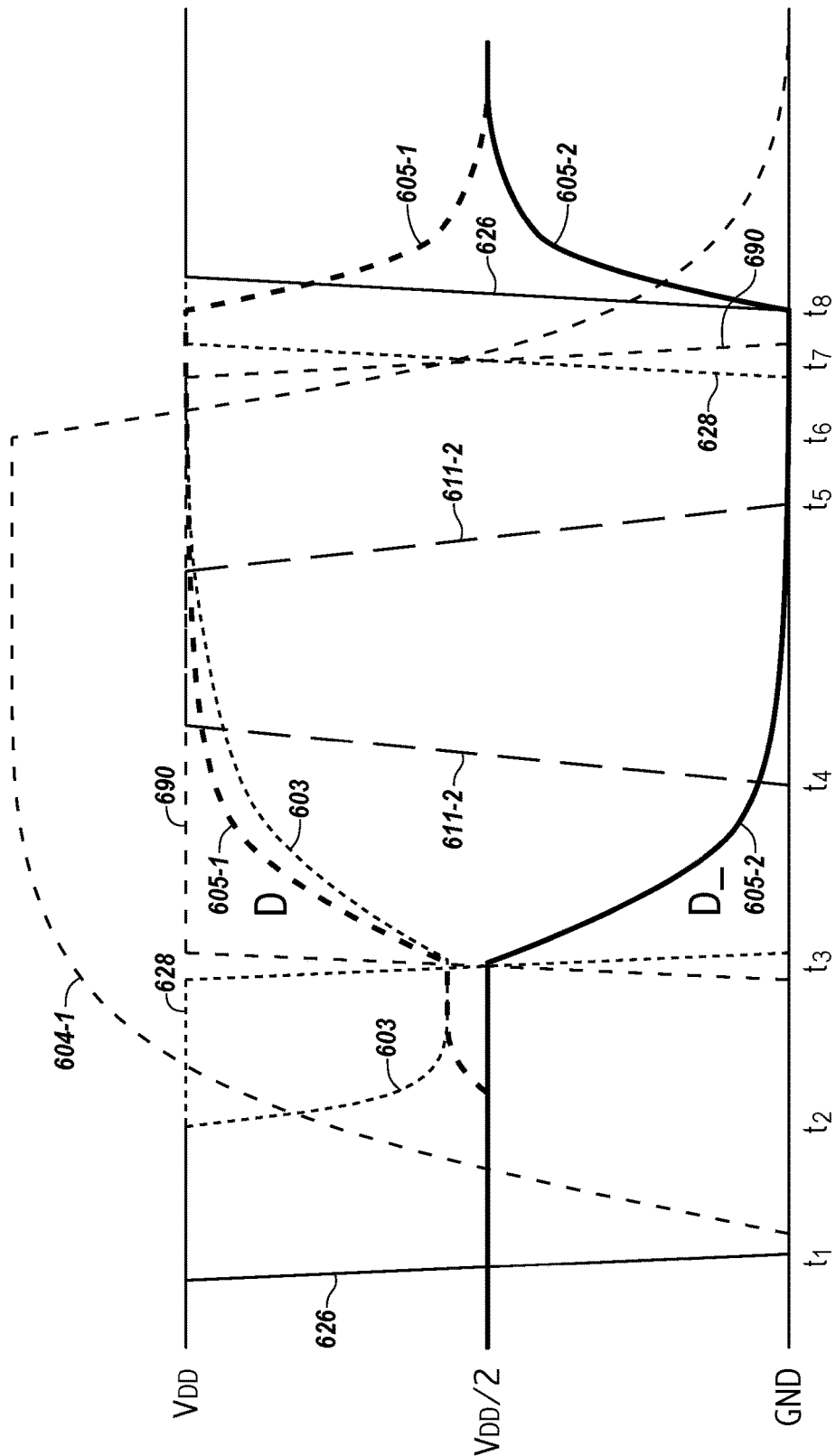

FIGS. 6B and 6C respectively illustrate timing diagrams associated with performing a number of logical operations using sensing circuitry in accordance with a number of embodiments of the present disclosure. Timing diagrams shown in FIGS. 6B and 6C illustrate signals (e.g., voltage signals) associated with performing a number of intermediate operation phases of a logical operation (e.g., an R-input logical operation). For instance, the timing diagram shown in FIG. 6B corresponds to a number of intermediate operation phases of an R-input NAND operation or an R-input AND operation, and timing diagram shown in FIG. 6C corresponds to a number of intermediate operation phases of an R-input NOR operation or an R-input OR operation. For example, performing an AND or NAND operation can include performing the operation phase shown in FIG. 6B one or more times subsequent to an initial operation phase such as that described with respect to FIG. 6A. Similarly, performing an OR or NOR operation can include performing the operation phase shown and described with respect to FIG. 6C one or more times subsequent to an initial operation phase such as that described with respect to FIG. 6A.

As shown in the timing diagrams illustrated in FIGS. 6B and 6C, at time $t_1$, equilibration is disabled (e.g., the equilibration signal 626 is deactivated), and then a selected row is enabled (e.g., the row corresponding to a memory cell whose data value is to be sensed and used as an input such as a second input, third input, etc.). Signal 604-1 represents the voltage signal applied to the selected row (e.g., Row 204-Y shown in FIG. 2A). When row signal 604-1 reaches the threshold voltage (Vt) of the access transistor (e.g., 202-3 shown in FIG. 2A) corresponding to the selected cell, the access transistor turns on and couples the data line D to the selected memory cell (e.g., to the capacitor 203-3 if the cell is a 1T1C DRAM cell), which creates a differential voltage signal between the data lines D and D_ (e.g., as indicated by signals 605-1 and 605-2, respectively) between times $t_2$ and $t_3$. The voltage of the selected cell is represented by signal 603. Due to conservation of energy, creating the differential signal between D and D_ (e.g., by coupling the cell to data line D) does not consume energy. However, the energy associated with activating/deactivating the row signal 604-1 can be amortized over the plurality of memory cells coupled to the row.

At time $t_3$, the sense amplifier (e.g., 206-2 shown in FIG. 2A) is enabled (e.g., a positive control signal 690 (e.g., corresponding to ACT 233 shown in FIG. 2B) goes high, and the negative control signal 628 (e.g., RnIF 228 shown in FIG. 2B) goes low). This amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_). As such, the sensed data value is stored in the primary latch of sense amplifier 206-2. The primary energy consumption occurs in charging the data line D (205-1) from the equilibration voltage $V_{DD}/2$ to the rail voltage $V_{DD}$.

As shown in timing diagrams illustrated in FIGS. 6B and 6C, at time $t_4$ (e.g., after the selected cell is sensed), only one of control signals 611-1 (PASSD) shown in FIG. 6B and 611-2 (PASSDB) shown in FIG. 6C is activated (e.g., only one of pass transistors (if present) is enabled), depending on the particular logic operation. For example, since the timing diagram illustrated in FIG. 6B corresponds to an intermediate phase of a NAND or AND operation, control signal 611-1 (PASSD) is activated at time $t_4$ to turn on the pass transistor coupling the primary latch to data line D and the PASSDB control signal remains deactivated leaving the pass transistor coupling the primary latch to data line D_ turned off. Conversely, since the timing diagram illustrated in FIG. 6C corresponds to an intermediate phase of a NOR or OR operation, control signal 611-2 (PASSDB) is activated at time $t_4$ to turn on the pass transistor coupling the primary latch to data line D_ and control signal PASSD remains deactivated leaving the pass transistor coupling the primary latch to data line D turned off. Recall from above that the accumulator control signals 612-1 (Accumb) and 612-2 (Accum) were activated during the initial operation phase described with respect to FIG. 6A, and they remain activated during the intermediate operation phase(s).

Since the accumulator was previously enabled, activating only PASSD (611-1 as shown in FIG. 6B) results in accumulating the data value corresponding to the voltage signal 605-1 shown in FIG. 6B corresponding to data line D. Similarly, activating only PASSDB (611-2 as shown in FIG. 6C) results in accumulating the data value corresponding to the voltage signal 605-2 corresponding to data line D_. For instance, in an example AND/NAND operation shown in the timing diagram illustrated in FIG. 6B in which only PASSD (611-1) is activated, if the data value stored in a second selected memory cell is a logic "0," then the accumulated value associated with the secondary latch is asserted low such that the secondary latch stores logic "0." If the data value stored in the second selected memory cell is not a logic "0," then the secondary latch retains its stored first selected memory cell data value (e.g., a logic "1" or a logic "0"). As such, in this AND/NAND operation example, the secondary latch is serving as a zeroes (0s).

Similarly, in an example OR/NOR operation shown in the timing diagram illustrated in FIG. 6C in which only PASSDB 611-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 605-2 on D_ is setting the true, e.g., "1," data value of the accumulator.

At the conclusion of an intermediate operation phase such as that shown in FIG. 6B or 6C, the PASSD signal 611-1 (e.g., for AND/NAND) or the PASSDB signal 611-2 (e.g., for OR/NOR) is deactivated (e.g., at time $t_5$), the selected row is disabled (e.g., at time $t_6$), the sense amplifier is disabled (e.g., at time t₇), and equilibration occurs (e.g., at time t₈). An intermediate operation phase such as that illustrated in FIG. 6B or 6C can be repeated in order to accumulate results from a number of additional rows. As an example, the sequence of timing diagram illustrated in FIGS. 6B and/or 6C can be performed a subsequent (e.g., second) time for a third memory cell, a subsequent (e.g., third) time for a fourth memory cell, etc. For instance, for a 10-input NOR operation, the intermediate phase shown in FIG. 6C can occur 9 times to provide 9 inputs of the 10-input logical operation, with the tenth input being determined during the initial operation phase (e.g., as described with respect to FIG. 6A).

Figure 6D:
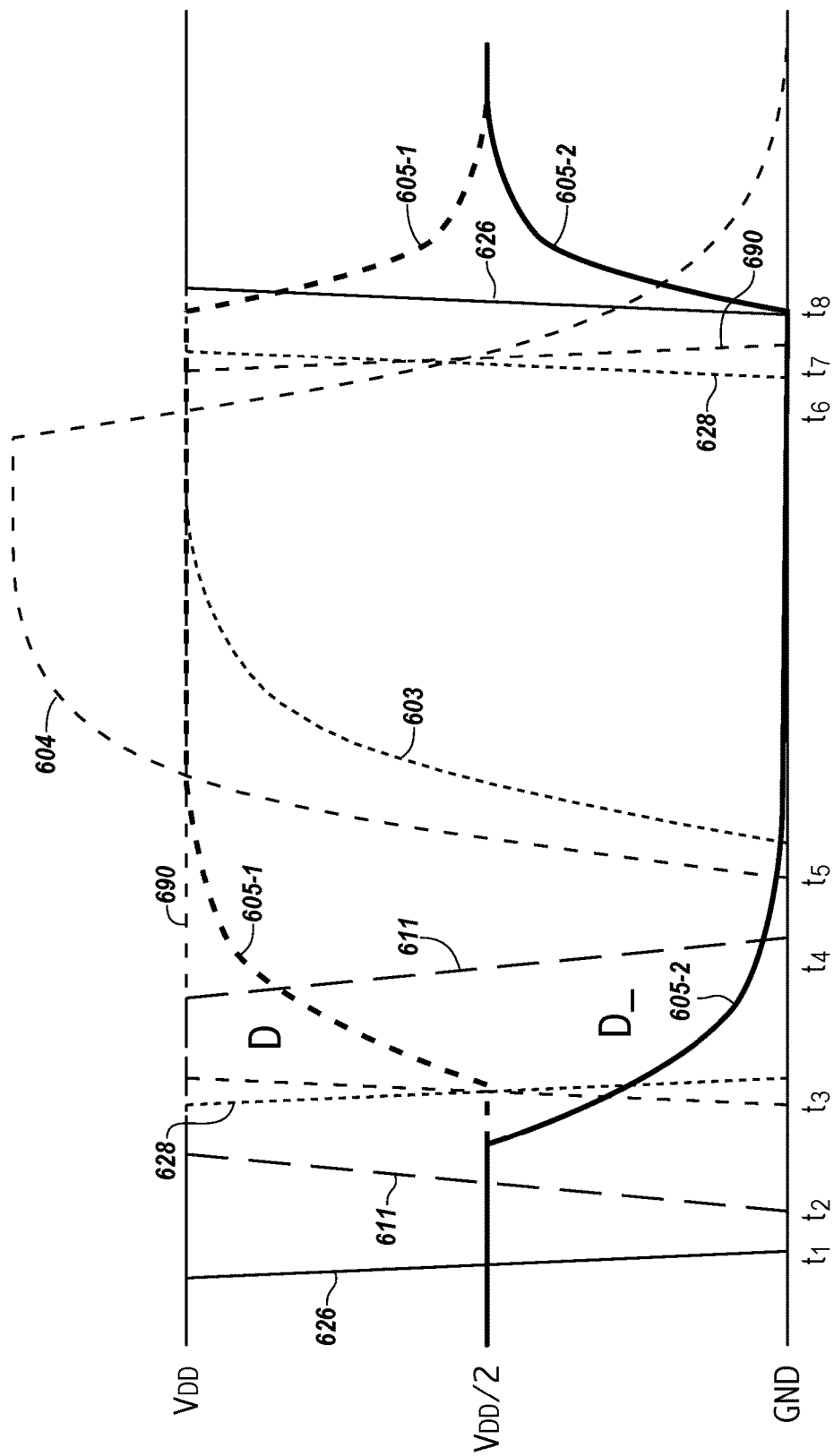

FIG. 6D illustrates a timing diagram associated with performing a number of logical operations using sensing circuitry in accordance with a number of embodiments of the present disclosure. The timing diagram illustrated in FIG. 6D shows signals (e.g., voltage signals) associated with performing a last operation phase of a logical operation (e.g., an R-input logical operation). For instance, the timing diagram illustrated in FIG. 6D corresponds to a last operation phase of an R-input AND operation or an R-input OR operation.

For example, performing a last operation phase of an R-input logical operation can include performing the operation phase shown in FIG. 6D subsequent to a number of iterations of the intermediate operation phase(s) described in association with FIGS. 6B and/or 6C. Table 2 shown below indicates the Figures corresponding to the sequence of operation phases associated with performing a number of R-input logical operations in accordance with a number of embodiments described herein.

TABLE 2

| Operation | FIG. 6A | FIG. 6B | FIG. 6C | FIG. 6D |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R−1 iterations for an AND operation in the sense amplifier, then inverting the sense amplifier before conducting the last operation phase to store the result (described below). A NOR operation can be implemented, for example, by storing the result of the R−1 iterations for an OR operation in the sense amplifier, then inverting the sense amplifier before conducting the last operation phase to store the result (described below).

The last operation phase illustrated in the timing diagram of FIG. 6D is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 6D, at time t₁, equilibration is disabled (e.g., the equilibration signal 626 is deactivated) such that data lines D and D_ are floating. At time t₂, the PASSD control signal 611 (and PASSDB signal) is activated for an AND or OR operation.

Activating the PASSD control signal 611 (and PASSDB signal) (e.g., in association with an AND or OR operation) transfers the accumulated output stored in the secondary latch of compute component 231-2 shown in FIG. 2A to the primary latch of sense amplifier 206-2. For instance, for an AND operation, if any of the memory cells sensed in the prior operation phases (e.g., the first operation phase illustrated in FIG. 6A and one or more iterations of the intermediate operation phase illustrated in FIG. 6B) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t₃, the primary latch of sense amplifier 206-2 is then enabled (e.g., a positive control signal 690 (e.g., corresponding to ACT 265 shown in FIG. 2B) goes high and the negative control signal 628 (e.g., corresponding to RnIF 228 shown in FIG. 2B) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 6A and one or more iterations of the intermediate operation phase shown in FIG. 6C) stored a logic "1" (e.g., if any of the R inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R inputs of the OR operation were logic "0"), then the data line D will carry a voltage corresponding to logic "0" and data line D_ will carry a voltage corresponding to logic "1." At time t₃, the primary latch of sense amplifier 206-2 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0".

The result of the R-input AND or OR logical operations can then be stored back to a memory cell of array 230 shown in FIG. 2A. In the examples shown in FIG. 6D, the result of the R-input logical operation is stored to a memory cell coupled to the last row enabled (e.g., row of the last logical operation operand).

Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 6D show, at time t₃, the positive control signal 690 and the negative control signal 628 being deactivated (e.g., signal 690 goes high and signal 628 goes low) to disable the sense amplifier 206-2 shown in FIG. 2A. At time $t_4$ the PASSD control signal 611 (and PASSDB signal) that was activated at time $t_2$ is deactivated. Embodiments are not limited to this example. For instance, in a number of embodiments, the sense amplifier 206-2 shown in FIG. 2A may be enabled subsequent to time $t_4$ (e.g., after the PASSD control signal 611 (and PASSDB signal) are deactivated).

As shown in FIG. 6D, at time $t_5$, a selected row is enabled (e.g., by row activation signal 604 going high, which drives the capacitor of the selected cell to the voltage corresponding to the logic value stored in the accumulator. At time $t_6$ the selected row is disabled. At time $t_7$ the sense amplifier 206-2 shown in FIG. 2A is disabled (e.g., positive control signal 628 and negative control signal 690 are deactivated in FIG. 6D), and at time $t_8$ equilibration occurs (e.g., signal 626 is activated and the voltages on the complementary data lines 605-1 (D) and 605-2 (D_) are brought to the equilibration voltage, as shown in FIG. 6D).

Although the example of performing a last operation phase of an R-input logical operation was discussed above with respect to FIG. 6D for performing AND and OR logical operations, embodiments are not limited to these logical operations. For example, NAND and NOR operations can also involve a last operation phase of an R-input logical operation that is stored back to a memory cell of array 230 using control signals to operate the sensing circuitry illustrated in FIG. 2A.

The functionality of the sensing circuitry 250-2 of FIG. 2A as described previously and summarized once again in Table 1 below with respect to performing logical operations and initially storing a result in the sense amplifier 206-2. Initially storing the result of a particular logical operation in the primary latch of sense amplifier 206-2 can provide improved versatility as compared to previous approaches in which the result may initially reside in a secondary latch (e.g., accumulator) of a compute component 231-2, and then be subsequently transferred to the sense amplifier 206-2, for instance.

Initially storing the result of a particular operation in the sense amplifier 206-2 (e.g., without having to perform an additional operation to move the result from the compute component 231-2 (e.g., accumulator) to the sense amplifier 206-2) is advantageous because, for instance, the result can be written to a row (of the array of memory cells) or back into the accumulator without performing a precharge cycle (e.g., on the complementary data lines 205-1 (D) and/or 205-2 (D_)).

Figure 7A:
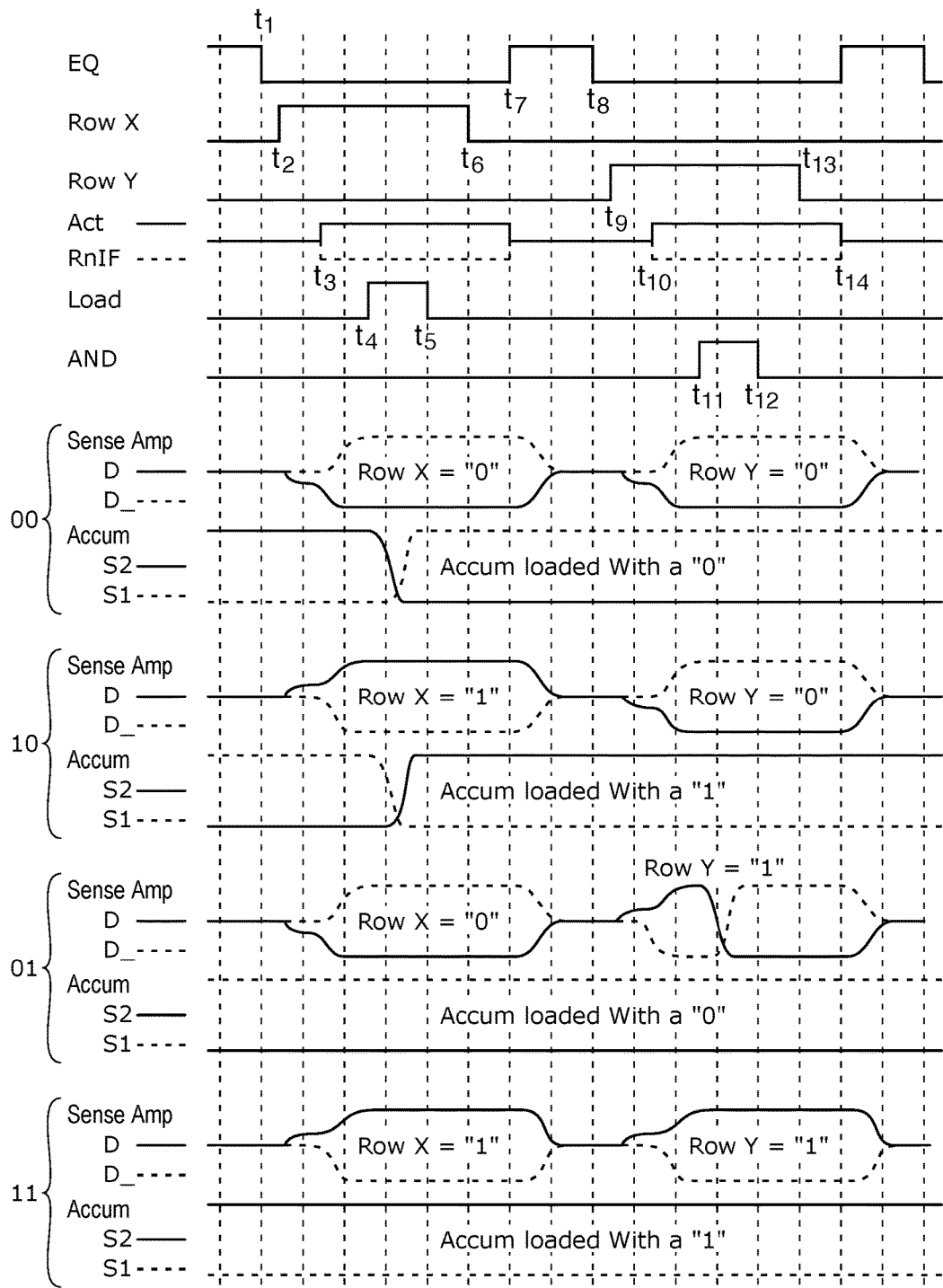
FIGS. 7A-7B illustrate timing diagrams associated with performing a number of logical operations using sensing circuitry in accordance with a number of embodiments of the present disclosure.

FIG. 7A illustrates a timing diagram associated with performing a number of logical operations using sensing circuitry in accordance with a number of embodiments of the present disclosure. FIG. 7A illustrates a timing diagram associated with initiating an AND logical operation on a first operand and a second operand. In this example, the first operand is stored in a memory cell coupled to a first access line (e.g., Row X) and the second operand is stored in a memory cell coupled to a second access line (e.g., Row Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 7A illustrates a number of control signals associated with operating sensing circuitry (e.g., 250-2 in FIG. 2A) to perform the AND logical operation. "EQ" corresponds to an equilibrate signal applied to the sense amplifier 206-2, "ROW X" corresponds to an activation signal applied to access line 204-X, "ROW Y" corresponds to an activation signal applied to access line 204-Y, "Act" and "RnIF" correspond to a respective active positive and negative control signals applied to the sense amplifier 206-2, "LOAD" corresponds to a load control signal (e.g., LOAD/PASSD and LOAD/PASSDB shown in FIG. 2A), and "AND" corresponds to the AND control signal shown in FIG. 2A. FIG. 7A also illustrates the waveform diagrams showing the signals (e.g., voltage signals) on the digit lines D and D_ corresponding to sense amplifier 206-2 and on the nodes S1 and S2 corresponding to the compute component 231-2 (e.g., accumulator) during an AND logical operation for the various data value combinations of the row X and row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:

Copy Row X into the Accumulator:
Deactivate EQ
Open Row X
Fire Sense Amplifiers (after which Row X data resides in the sense amplifiers)
Activate LOAD (sense amplifier data (Row X) is transferred to nodes S1 and S2 of the Accumulator and resides there dynamically)
Deactivate LOAD
Close Row X
Precharge In the pseudo code above, "Deactivate EQ" indicates that an equilibration signal (EQ signal shown in FIG. 7A) corresponding to the sense amplifier 206-2 is disabled at $t_1$ as shown in FIG. 7A (e.g., such that the complementary data lines (e.g., 205-1 (D) and 205-2 (D_) are no longer shorted to $V_{DD}/2$). After equilibration is disabled, a selected row (e.g., Row X) is enabled (e.g., selected, opened such as by activating a signal to select a particular row) as indicated by "Open Row X" in the pseudo code and shown at $t_2$ for signal ROW X in FIG. 7A. When the voltage signal applied to ROW X reaches the threshold voltage (Vt) of the access transistor (e.g., 202-4) corresponding to the selected cell, the access transistor turns on and couples the data line (e.g., 205-2 (D_)) to the selected cell (e.g., to capacitor 203-4) which creates a differential voltage signal between the data lines.

After Row X is enabled, in the pseudo code above, "Fire Sense Amplifiers" indicates that the sense amplifier 206-2 is enabled to set the primary latch, as has been described herein, and subsequently disabled. For example, as shown at $t_3$ in FIG. 7A, the ACT positive control signal (e.g., 265 shown in FIG. 2B) goes high and the RnIF negative control signal (e.g., 228 shown in FIG. 2B) goes low, which amplifies the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D). The voltage corresponding to the other logic is placed on the complementary data line 205-2 (D_). The sensed data value is stored in the primary latch of sense amplifier 206-2. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 7A (e.g., one for each combination of Row X and Row Y data values) show the behavior of signals on data lines D and D_. The Row X data value is stored in the primary latch of the sense amplifier. It should be noted that FIG. 2A shows that the memory cell including storage element 203-4, corresponding to Row X, is coupled to the complementary data line D_, while the memory cell including storage element 203-3, corresponding to Row Y, is coupled to data line D. However, as can be seen in FIG. 2A, the charge stored in memory cell 201-4 (corresponding to Row X) corresponding to a "0" data value causes the voltage on data line D_ (to which memory cell 201-4 is coupled) to go high and the charge stored in memory cell 201-4 corresponding to a "1" data value causes the voltage on data line D_ to go low, which is opposite correspondence between data states and charge stored in memory cell 201-4, corresponding to Row Y, that is coupled to data line D. These differences in storing charge in memory cells coupled to different data lines is appropriately accounted for when writing data values to the respective memory cells.

After firing the sense amplifiers, in the pseudo code above, "Activate LOAD" indicates that the LOAD control signal goes high as shown at $t_4$ in FIG. 7A, causing load/pass transistors 218-1 and 218-2 to conduct. In this manner, activating the LOAD control signal enables the secondary latch in the accumulator of the compute component 231-2. The sensed data value stored in the sense amplifier 206-2 is transferred (e.g., copied) to the secondary latch. As shown for each of the four sets of possible sense amplifier and accumulator signals illustrated in FIG. 7A, the behavior at inputs of the secondary latch of the accumulator indicates the secondary latch is loaded with the Row X data value. As shown in FIG. 7A, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_) in FIG. 2A) in the pseudo code above, "Deactivate LOAD" indicates that the LOAD control signal goes back low as shown at $t_5$ in FIG. 7A to cause the load/pass transistors 218-1 and 218-2 to stop conducting and thereby isolate the dynamic latch from the complementary data lines. However, the data value remains dynamically stored in the secondary latch of the accumulator.

After storing the data value on the secondary latch, the selected row (e.g., Row X) is disabled (e.g., deselected, closed such as by deactivating a select signal for a particular row (e.g., the ROW X signal)) as indicated by "Close Row X" and indicated at $t_6$ in FIG. 7A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 7A by the EQ signal going high at $t_7$. As shown in each of the four sets of possible sense amplifier and accumulator signals illustrated in FIG. 7A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206-2 and the secondary latch of the compute component 231-2 shown in FIG. 2A) and the second data value (stored in a memory cell 201-3 coupled to Row 204-Y) includes performing particular steps which depend on the whether an AND or an OR is to be performed. Examples of pseudo code associated with "ANDing" and "ORing" the data value residing in the accumulator (e.g., the first data value stored in the memory cell 201-4 coupled to Row X 204-X) and the second data value (e.g., the data value stored in the memory cell 201-3 coupled to Row Y 204-Y) are summarized below. Example pseudo code associated with "ANDing" the data values can include:

Deactivate EQ
Open Row Y
Fire Sense Amplifiers (after which Row Y data resides in the sense amplifiers)
Close Row Y
  The result of the logic operation, in the next operation, will be placed on the sense amplifier, which will overwrite any row that is active.
  Even when Row Y is closed, the sense amplifier still contains the Row Y data value.
Activate AND
This results in the sense amplifier being written to the value of the function (e.g., Row X AND Row Y)
If the accumulator contains a "0" (i.e., a voltage corresponding to a "0" on node S2 and a voltage corresponding to a "1" on node S1), the sense amplifier data is written to a "0"
If the accumulator contains a "1" (i.e., a voltage corresponding to a "1" on node S2 and a voltage corresponding to a "0" on node S1), the sense amplifier data remains unchanged (Row Y data)
This operation leaves the data in the accumulator unchanged.
Deactivate AND
Precharge In the pseudo code above, "Deactivate EQ" indicates that an equilibration signal corresponding to the sense amplifier 206-2 is disabled (e.g., such that the complementary data lines 205-1 (D) and 205-2 (D_) are no longer shorted to $V_{DD}/2$), which is illustrated in FIG. 7A at $t_8$. After equilibration is disabled, a selected row (e.g., Row Y) is enabled as indicated in the pseudo code above by "Open Row Y" and shown in FIG. 7A at $t_9$. When the voltage signal applied to ROW Y reaches the threshold voltage (Vt) of the access transistor (e.g., 202-3) corresponding to the selected cell, the access transistor turns on and couples the data line (e.g., D_ 205-2) to the selected cell (e.g., to capacitor 203-3) which creates a differential voltage signal between the data lines.

After Row Y is enabled, in the pseudo code above, "Fire Sense Amplifiers" indicates that the sense amplifier 206-2 is enabled to amplify the differential signal between 205-1 (D) and 205-2 (D_), resulting in a voltage (e.g., $V_{DD}$) corresponding to a logic "1" or a voltage (e.g., GND) corresponding to a logic "0" being on data line 205-1 (D). The voltage corresponding to the other logic state is on complementary data line 205-2 (D_). As shown at $t_{10}$ in FIG. 7A, the ACT positive control signal (e.g., 265 shown in FIG. 2B) goes high and the RnIF negative control signal (e.g., 228 shown in FIG. 2B) goes low to fire the sense amplifiers. The sensed data value from memory cell 201-3 is stored in the primary latch of sense amplifier 206-2, as previously described. The secondary latch still corresponds to the data value from memory cell 201-4 since the dynamic latch is unchanged.

After the second data value sensed from the memory cell 201-3 coupled to Row Y is stored in the primary latch of sense amplifier 206-2, in the pseudo code above, "Close Row Y" indicates that the selected row select signal (e.g., ROW Y) can be disabled if it is not desired to store the result of the AND logical operation back in the memory cell corresponding to Row Y. However, FIG. 7A shows that ROW Y is left enabled such that the result of the logical operation can be stored back in the memory cell corresponding to Row Y. Isolating the memory cell corresponding to Row Y can be accomplished by the access transistor turning off to decouple the selected cell 201-3 from the data line 205-1 (D).

After the selected Row Y is configured (e.g., to isolate the memory cell or not isolate the memory cell), "Activate AND" in the pseudo code above indicates that the AND control signal goes high as shown in FIG. 7A at $t_{11}$, causing pass transistor 207-1 to conduct. In this manner, activating the AND control signal causes the value of the function (e.g., Row X AND Row Y) to be written to the sense amplifier.

With the first data value (e.g., Row X) stored in the dynamic latch of the accumulator 231-2 and the second data value (e.g., Row Y) stored in the sense amplifier 206-2, if the dynamic latch of the compute component 231-2 contains a "0" (i.e., a voltage corresponding to a "0" on node S2 and a voltage corresponding to a "1" on node S1), a "0" is stored in the sense amplifier (regardless of the data value previously stored in the sense amplifier). This is because the voltage corresponding to a "1" on node S1 causes transistor 209-1 to conduct thereby coupling the sense amplifier 206-2 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value. Thus, the configuration of the sensing circuitry causes the "0" result to be written and initially stored in the sense amplifier 206-2. This operation leaves the data value in the accumulator unchanged (e.g., from Row X).

If the secondary latch of the accumulator contains a "1" (e.g., from Row X), then the result of the AND operation depends on the data value stored in the sense amplifier 206-2 (e.g., from Row Y). The result of the AND operation should be a "1" if the data value stored in the sense amplifier 206-2 (e.g., from Row Y) is also a "1," but the result of the AND operation should be a "0" if the data value stored in the sense amplifier 206-2 (e.g., from Row Y) is a "0." The sensing circuitry 250-2 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206-2 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206-2, "Deactivate AND" in the pseudo code above indicates that the AND control signal goes low as shown at $t_{12}$ in FIG. 7A, causing pass transistor 207-1 to stop conducting to isolate the sense amplifier 206-2 (and data line 205-1 (D)) from ground. If not previously done, Row Y can be closed (as shown at $t_{13}$ in FIG. 7A) and the sense amplifier can be disabled (as shown at $t_{14}$ in FIG. 7A by the ACT positive control signal going low and the RnIF negative control signal going high). With the data lines isolated, "Precharge" in the pseudo code above can cause a precharge of the data lines by an equilibrate operation, as described previously (e.g., commencing at $t_{14}$ shown in FIG. 7A).

FIG. 7A shows, in the alternative, the behavior of voltage signals on the data lines (e.g., 205-1 (D) and 205-2 (D_) shown in FIG. 2A) coupled to the sense amplifier (e.g., 206-2 shown in FIG. 2A) and the behavior of voltage signals on nodes S1 and S1 of the secondary latch of the compute component (e.g., 231-2 shown in FIG. 2A) for an AND logical operation involving each of the possible combinations of operands (e.g., Row X/Row Y data values 00, 10, 01, and 11).

Although the timing diagrams illustrated in FIG. 7A and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 7B:
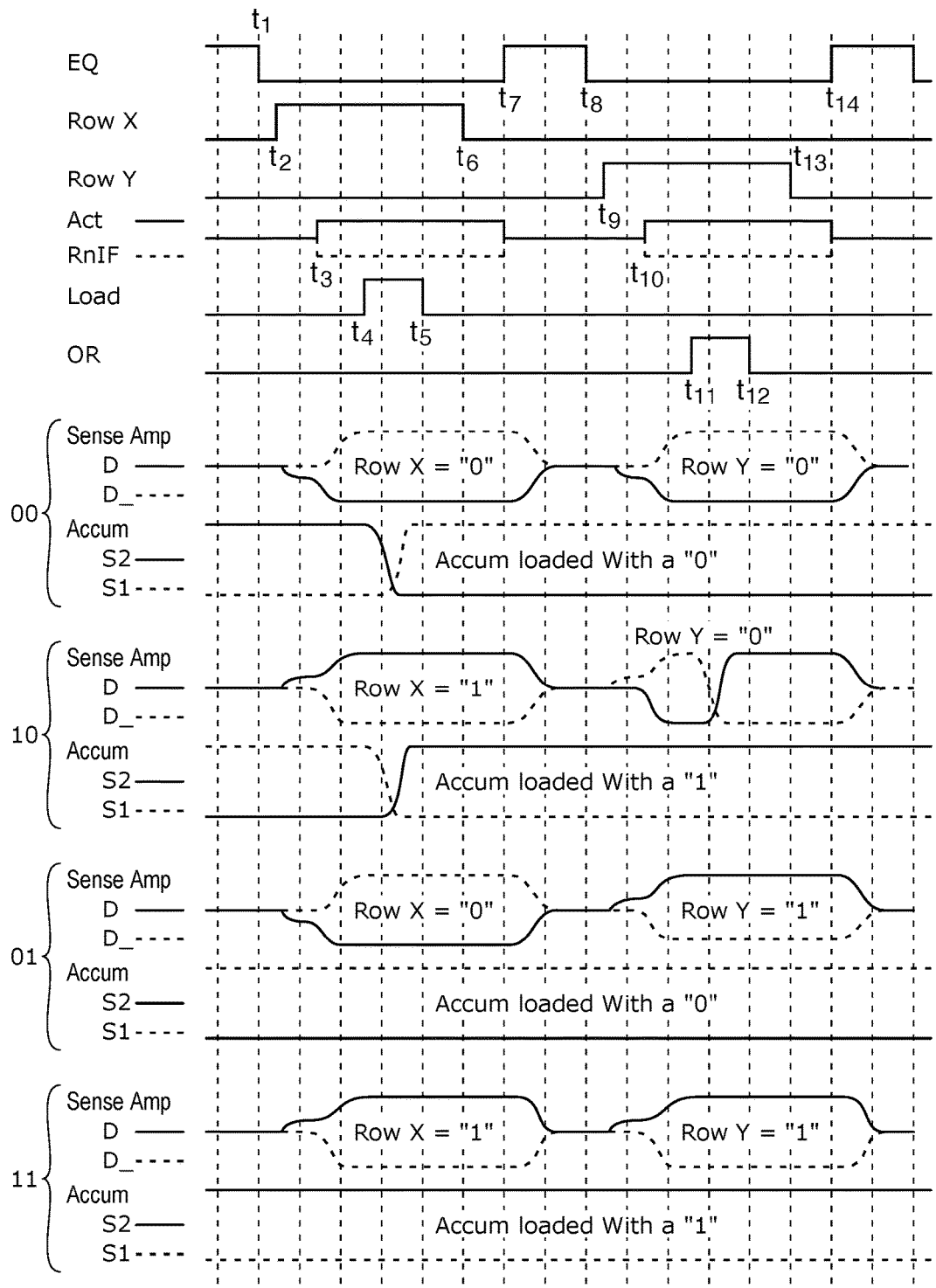

FIG. 7B illustrates a timing diagram associated with performing a number of logical operations using sensing circuitry in accordance with a number of embodiments of the present disclosure. FIG. 7B illustrates a timing diagram associated with initiating an OR logical operation after starting to load the second operand (e.g., Row Y data value) into the sense amplifier. FIG. 7B illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206-2 and the secondary latch of the compute component 231-2) and the second data value (stored in a memory cell 201-3 coupled to Row Y 204-Y). The operations to load the Row X data into the sense amplifier and accumulator that were previously described with respect to times $t_1$-$t_7$ shown in FIG. 7A are not repeated with respect to FIG. 7B. Example pseudo code associated with "ORing" the data values can include:

Deactivate EQ
Open Row Y
Fire Sense Amplifiers (after which Row Y data resides in the sense amplifiers)
Close Row Y
   When Row Y is closed, the sense amplifier still contains the Row Y data value.
Activate OR
   This results in the sense amplifier being written to the value of the function (e.g., Row X OR Row Y), which may overwrite the data value from Row Y previously stored in the sense amplifier as follows:
   If the accumulator contains a "0" (i.e., a voltage corresponding to a "0" on node S2 and a voltage corresponding to a "1" on node S1), the sense amplifier data remains unchanged (Row Y data)
   If the accumulator contains a "1" (i.e., a voltage corresponding to a "1" on node S2 and a voltage corresponding to a "0" on node S1), the sense amplifier data is written to a "1"
   This operation leaves the data in the accumulator unchanged.

Deactivate OR

Precharge

The "Deactivate EQ" (shown at $t_8$ in FIG. 7B), "Open Row Y" (shown at $t_9$ in FIG. 7B), "Fire Sense Amplifiers" (shown at $t_{10}$ in FIG. 7B), and "Close Row Y" (shown at $t_{13}$ in FIG. 7B, and which may occur prior to initiating the particular logical function control signal), shown in the pseudo code above, indicate the same functionality as previously described with respect to the AND operation pseudo code. Once the configuration of selected Row Y is appropriately configured (e.g., enabled if a logical operation result is to be stored in a memory cell corresponding to Row Y or closed to isolate a memory cell if a logical operation result is not to be stored in memory cell corresponding to Row Y), "Activate OR" in the pseudo code above indicates that the OR control signal goes high as shown at $t_{11}$ in FIG. 7B, which causes pass transistor 207-2 to conduct. In this manner, activating the OR control signal causes the value of the function (e.g., Row X OR Row Y) to be written to the sense amplifier.

With the first data value (e.g., Row X) stored in the secondary latch of the compute component 231-2 and the second data value (e.g., Row Y) stored in the sense amplifier 206-2, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206-2 (e.g., from Row Y). The result of the OR operation should be a "1" if the data value stored in the sense amplifier 206-2 (e.g., from Row Y) is a "1," but the result of the OR operation should be a "0" if the data value stored in the sense amplifier 206-2 (e.g., from Row Y) is also a "0." The sensing circuitry 250-2 is configured such that if the dynamic latch of the accumulator contains a "0," with the voltage corresponding to a "0" on node S2, transistor 209-2 is off and does not conduct (and pass transistor 207-1 is also off since the AND control signal is not asserted) so the sense amplifier 206-2 is not coupled to ground (either side), and the data value previously stored in the sense amplifier 206-2 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206-2 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206-2 as a result of the OR operation when the secondary latch of the accumulator contains a "1" regardless of the data value previously stored in the sense amplifier. This operation leaves the data in the accumulator unchanged. FIG. 7B shows, in the alternative, the behavior of voltage signals on the data lines (e.g., 205-1 (D) and 205-2 (D_) shown in FIG. 2A) coupled to the sense amplifier (e.g., 206-2 shown in FIG. 2A) and the behavior of voltage signals on nodes S1 and S2 of the secondary latch of the compute component 231-2 for an OR logical operation involving each of the possible combinations of operands (e.g., Row X/Row Y data values 00, 10, 01, and 11).

After the result of the OR operation is initially stored in the sense amplifier 206-2, "Deactivate OR" in the pseudo code above indicates that the OR control signal goes low as shown at $t_{12}$ in FIG. 7B, causing pass transistor 207-2 to stop conducting to isolate the sense amplifier 206-2 (and data line D 205-2) from ground. If not previously done, Row Y can be closed (as shown at $t_{13}$ in FIG. 7B) and the sense amplifier can be disabled (as shown at $t_{14}$ in FIG. 4 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 7B.

The sensing circuitry 250-2 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORinv control signal can be asserted instead of the OR control signal. Activating the ORinv control signal causes transistor 214-2 to conduct and activating the ANDinv control signal causes transistor 214-1 to conduct. In each case, asserting the appropriate inverted control signal can flip the sense amplifier and cause the result initially stored in the sense amplifier 206-2 to be that of the AND operation using the inverted Row X and true Row Y data values or that of the OR operation using the inverted Row X and true Row Y data values. A true or complement version of one data value can be used in the accumulator to perform a logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206-2. As previously mentioned, activating the ORinv control signal causes transistor 214-2 to conduct and activating the ANDinv control signal causes transistor 214-1 to conduct. The ORinv and/or ANDinv control signals are used in implementing the NOT function, as described in the pseudo code below:

Copy Row X into the Accumulator:

Deactivate EQ

Open Row X

Fire Sense Amplifiers (after which Row X data resides in the sense amplifiers)

Activate LOAD (sense amplifier data (Row X) is transferred to nodes S1 and S2 of the Accumulator and resides there dynamically Deactivate LOAD Activate ANDinv and ORinv (which puts the complement data value on the data lines)

This results in the data value in the sense amplifier being inverted (e.g., the sense amplifier latch is flipped)

This operation leaves the data in the accumulator unchanged

Deactivate ANDinv and ORinv

Close Row X
Precharge

The "Deactivate EQ," "Open Row X," "Fire Sense Amplifiers," "Activate LOAD," and "Deactivate LOAD" operations shown in the pseudo code above indicate the same functionality as the same operations in the pseudo code for the "Copy Row X into the Accumulator" initial operation phase described above for the AND operation and OR operation. However, rather than closing the Row X and precharging after the Row X data is loaded into the sense amplifier 206-2 and copied into the dynamic latch, a complement version of the data value in the dynamic latch of the accumulator can be placed on the data line and thus transferred to the sense amplifier 206-2. This is done by enabling (e.g., causing a transistor to conduct and disabling the invert transistors (e.g., ANDinv and ORinv). This results in the sense amplifier 206-2 being flipped from the true data value that was previously stored in the sense amplifier to a complement data value (e.g., inverted data value) being stored in the sense amplifier. As such, a true or complement version of the data value in the accumulator can be transferred to the sense amplifier based upon activating or not activating ANDinv and/or ORinv. This operation leaves the data in the accumulator unchanged.

Because the sensing circuitry 250-2 shown in FIG. 2A initially stores the result of the AND, OR, and/or NOT logical operations in the sense amplifier 206-2 (e.g., on the sense amplifier nodes), these logical operation results can be communicated easily and quickly to any enabled row, any row activated after the logical operation is complete, and/or into the secondary latch of the compute component 231-2. The sense amplifier 206-2 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206-2 fires.

When performing logical operations in this manner, the sense amplifier 206-2 can be pre-seeded with a data value from the dynamic latch of the accumulator to reduce overall current utilized because the sense amplifiers 206-2 are not at full rail voltages (e.g., supply voltage or ground/reference voltage) when the accumulator function is copied to the sense amplifier 206-2. An operation sequence with a pre-seeded sense amplifier 206-2 either forces one of the data lines to the reference voltage (leaving the complementary data line at $V_{DD}/2$, or leaves the complementary data lines unchanged. The sense amplifier 206-2 pulls the respective data lines to full rails when the sense amplifier 206-2 fires. Using this sequence of operations will overwrite data in an enabled row.

A SHIFT operation can be accomplished by multiplexing ("muxing") two neighboring data line complementary pairs using a DRAM isolation (ISO) scheme. According to embodiments of the present disclosure, the shift circuitry 223 can be used for shifting data values stored in memory cells coupled by a particular pair of complementary data lines to the sensing circuitry 250-2 (e.g., sense amplifier 206-2) corresponding to a different pair of complementary data lines (e.g., such as a sense amplifier 206-2 corresponding to a left or right adjacent pair of complementary data lines). As used herein, a sense amplifier 206-2 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized by the following pseudo code:

Deactivate Norm and Activate Shift
Deactivate EQ
Open Row X
Fire Sense Amplifiers (after which shifted Row X data resides in the sense amplifiers)
Activate Norm and Deactivate Shift
Close Row X
Precharge In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206-3 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amplifiers" operations shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206-3.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and a SHIFT control signal goes low causing isolation transistors 221-3 and 221-4 to not conduct and isolating the sense amplifier 206-3 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

Activate Norm and Deactivate Shift
Deactivate EQ
Open Row X
Fire Sense Amplifiers (after which Row X data resides in the sense amplifiers)
Deactivate Norm and Activate Shift Sense amplifier data (shifted left Row X) is transferred to Row X
Close Row X
Precharge In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206-2 to a corresponding pair of complementary data lines and isolates the sense amplifier from the right adjacent pair of complementary data lines.

After the shift circuitry is configured, the "Deactivate EQ," "Open Row X," and "Fire Sense Amplifiers" operations shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 250-2 is stored in the sense amplifier 206-2.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, the apparatus of the present disclosure can perform ANDS or ORs in parallel, e.g., concurrently, using data values in memory cells coupled to a word line (e.g., a row of 16,384 memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving an off pitch processing unit discrete from the memory such that data must be transferred there between. An apparatus and/or methods according to the present disclosure can also use less energy/area than configurations where the logical operation is discrete from the memory. Furthermore, an apparatus and/or methods of the present disclosure can provide additional energy/area advantages since the in-memory-array logical operations eliminate certain data value transfers.

What is claimed is:

1. A method comprising:
  receiving a first bit-vector and a second bit-vector in a format associated with storing the first bit-vector in memory cells coupled to a first access line and a first number of sense lines and storing the second bit-vector in memory cells coupled to the first access line and a second number of sense lines, wherein each of the memory cells of the first number of sense lines are separated from another memory cell of the first number of sense lines by at least one memory cell of the second number of sense lines;
  merging the first bit-vector and the second bit vector into a format associated with storing the first bit-vector in a number of memory cells coupled to the first access line and a third number of sense lines and storing the second bit-vector in a number of memory cells coupled to a second access line and the third number of sense lines; and
  performing an operation on the first bit-vector and the second bit-vector.

2. The method of claim 1, wherein each of the memory cells of the third number of sense lines are adjacent to another of the memory cells of the third number of sense lines.

3. The method of claim 1, wherein performing the operation comprises performing at least one of a number of AND operations, OR operations, SHIFT operations, INVERT operations, and XOR operations without a sense line address access.

4. The method of claim 3, wherein performing the at least one of the number of AND, OR, SHIFT, INVERT, XOR operations comprises performing the at least one of the number of AND, OR, SHIFT, INVERT, XOR operations using sensing circuitries coupled to respective columns of complementary sense lines, and wherein each of the sensing circuitries includes a sense amplifier comprising a primary latch and a compute component comprises a secondary latch.

5. The method of claim 1, wherein the format corresponds to a logical organization of the first access line and the third number of sense lines and the second access line and the third number of sense lines.

6. The method of claim 5, wherein storing the first bit-vector in a number of physical memory cells coupled to the first access line and the first number of sense lines comprises modifying the format associated with physical storing of the first bit-vector and logically storing the first bit-vector in a number of memory cells coupled to the first access line and the third number of sense lines.

7. The method of claim 1, wherein performing the operation on the first bit-vector and the second bit-vector comprises performing, in parallel, logical operations between respective bits of the first bit-vector and the second bit-vector.

8. The method of claim 1, further comprising storing at least a portion of the first bit-vector in the number of physical memory cells that are coupled to the first access line and a first, third, fifth, and seventh ordered sense lines of the number of sense lines.

9. The method of claim 8, further comprising storing the second bit-vector in the number of memory cells coupled to the first access line and a second, fourth, sixth, and eighth ordered sense lines of the number of sense lines.

10. The method of claim 8, wherein the method includes storing the first bit-vector in physical memory cells that are each separated from another of the memory cells storing the first bit-vector by each of the memory cells storing the second bit-vector.

11. The method of claim 1, further comprising storing at least a portion of the first bit-vector in the number of physical memory cells that are coupled to the first access line and a first, second, fifth, and sixth ordered sense lines of the number of sense lines.

12. The method of claim 11, further comprising storing the second bit-vector in the number of memory cells coupled to the first access line and a third, fourth, seventh, and eighth ordered sense lines of the number of sense lines.

13. The method of claim 1, further comprising:
receiving a third bit-vector in a format associated with storing the third bit-vector in memory cells coupled to a second access line and the first number of sense lines; and
merging the third bit-vector in memory cells coupled to a third access line and the first number of sense lines.

14. An apparatus comprising:
a first group of memory cells coupled to a first access line and a number of first sense lines in a memory array and configured to store a first bit-vector;
a second group of memory cells coupled to the first access line and a number of second sense lines in the memory array and configured to store a second bit-vector; and
a controller configured to operate sensing circuitry to:
logically merge each respective memory cell of the number of second sense lines to be aligned with sensing circuitry of a respective memory cell of the number of first sense lines; and
perform an operation on the first bit-vector and the second bit-vector.

15. The apparatus of claim 14, wherein a bit width of the second bit-vector is less than a quantity of memory cells coupled to the first access line.

16. The apparatus of claim 14, wherein performing the operation comprises performing the operation on a first bit of the first bit-vector stored in a memory cell coupled to the first access line and a first of the number of first sense lines and a first bit of the second bit-vector logically merged to be associated with a corresponding sensing circuitry coupled to the first of the number of first sense lines.

17. A method, comprising:
mapping each respective bit of a first bit-vector to each respective bit of a second bit-vector;
wherein:
the first bit-vector is stored in a first group of memory cells coupled to a number of first sense lines and to an access line of a memory array; and
the second bit-vector is stored in a second group of memory cells coupled to a number of second sense lines and the access line of the memory array;
performing an operation on:
the first bit-vector; and
the second bit-vector;
wherein the operation is performed using sensing circuitry comprising transistors formed on pitch with the memory cells of the memory array.

18. The method of claim 17, wherein mapping comprises shifting the first bit-vector from sensing circuitry coupled to the number of first sense lines to sensing circuitry coupled to the number of second sense lines.

19. The method of claim 18, wherein a quantity of the number of first sense lines is a power of two and the quantity of the number of second sense lines is a power of two.

20. The method of claim 18, wherein the first bit-vector is shifted a quantity of bit positions that is associated with a quantity of the number of first sense lines and a quantity of the number of second sense lines.

* * * * *